US012039986B2

(12) United States Patent
Tomasek et al.

(10) Patent No.: US 12,039,986 B2
(45) Date of Patent: Jul. 16, 2024

(54) DECODER AND DECODING METHOD FOR LC3 CONCEALMENT INCLUDING FULL FRAME LOSS CONCEALMENT AND PARTIAL FRAME LOSS CONCEALMENT

(71) Applicant: Fraunhofer-Gesellschaft zur Förderung der angewandten Forschung e.V., Munich (DE)

(72) Inventors: Adrian Tomasek, Erlangen (DE); Ralph Sperschneider, Erlangen (DE); Jan Büthe, Erlangen (DE); Conrad Benndorf, Erlangen (DE); Martin Dietz, Erlangen (DE); Markus Schnell, Erlangen (DE); Maximilian Schlegel, Erlangen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 57 days.

(21) Appl. No.: 17/394,068

(22) Filed: Aug. 4, 2021

(65) Prior Publication Data
US 2021/0366498 A1 Nov. 25, 2021

Related U.S. Application Data

(63) Continuation of application No. PCT/EP2020/053620, filed on Feb. 12, 2020.

(30) Foreign Application Priority Data

Feb. 13, 2019 (EP) .................................. 19156997.9
Feb. 13, 2019 (EP) .................................. 19157036.5
(Continued)

(51) Int. Cl.
*G10L 19/035* (2013.01)
*G10L 19/022* (2013.01)
(Continued)

(52) U.S. Cl.
CPC .......... *G10L 19/035* (2013.01); *G10L 19/022* (2013.01); *G10L 21/0324* (2013.01);
(Continued)

(58) Field of Classification Search
CPC . G10L 19/035; G10L 19/022; G10L 21/0324; G10L 19/02; G10L 19/005;
(Continued)

(56) References Cited

U.S. PATENT DOCUMENTS 5,148,271 A 9/1992 Kato et al.
5,712,861 A 1/1998 Inoue et al.
(Continued)

FOREIGN PATENT DOCUMENTS

CN 1343390 A 4/2002
CN 1732512 A 2/2006
(Continued)

OTHER PUBLICATIONS

Dun, Yujie, et al. "An extrapolation method for MDCT domain frame loss concealment." 2014 IEEE China Summit & International Conference on Signal and Information Processing (ChinaSIP). IEEE, 2014, pp. 650-654 (Year: 2014).*
(Continued)

*Primary Examiner* — Jesse S Pullias
*Assistant Examiner* — Michael C. Lee
(74) *Attorney, Agent, or Firm* — Perkins Coie LLP; Michael A. Glenn

(57) ABSTRACT

FIG. 1 illustrates a decoder for decoding a current frame to reconstruct an audio signal according to an embodiment. The audio signal is encoded within the current frame. The current frame includes a current bitstream payload. The current bitstream payload includes a plurality of payload bits. The plurality of payload bits encodes a plurality of spectral lines of a spectrum of the audio signal. Each of the
(Continued)

payload bits exhibits a position within the current bitstream payload. The decoder includes a decoding module and an output interface. The decoding module is configured to reconstruct the audio signal. The output interface is configured to output the audio signal.

16 Claims, 9 Drawing Sheets

(30) Foreign Application Priority Data

| Feb. 13, 2019 | (EP) | ................................ | 19157042.3 |
|---|---|---|---|
| Feb. 13, 2019 | (EP) | ................................ | 19157047.2 |
| Jun. 11, 2019 | (WO) | ................ | PCT/EP2019/065172 |
| Jun. 11, 2019 | (WO) | ................ | PCT/EP2019/065205 |
| Jun. 11, 2019 | (WO) | ................ | PCT/EP2019/065209 |

(51) Int. Cl.

| G10L 21/0324 | (2013.01) |
|---|---|
| H03M 13/07 | (2006.01) |
| H03M 13/15 | (2006.01) |
| H04B 17/309 | (2015.01) |
| H04L 1/00 | (2006.01) |

(52) U.S. Cl.
CPC ....... *H03M 13/07* (2013.01); *H03M 13/1515* (2013.01); *H04B 17/309* (2015.01); *H04L 1/0009* (2013.01); *H04L 1/0032* (2013.01); *H04L 1/0042* (2013.01); *H04L 1/0045* (2013.01); *H04L 1/0046* (2013.01); *H04L 1/0084* (2013.01)

(58) Field of Classification Search
CPC . G10L 19/008; G10L 19/0212; G10L 19/032; G10L 19/04; G10L 19/20; H03M 13/07; H03M 13/1515; H04B 17/309; H04L 1/0009; H04L 1/0032; H04L 1/0042; H04L 1/0045; H04L 1/0046; H04L 1/0084; H04L 1/0041
See application file for complete search history.

(56) References Cited

U.S. PATENT DOCUMENTS

| 5,852,469 | A | 12/1998 | Nagai et al. |
|---|---|---|---|
| 5,862,518 | A | 1/1999 | Nomura et al. |
| 6,256,064 | B1 | 7/2001 | Chujoh et al. |
| 6,256,487 | B1 | 7/2001 | Bruhn |
| 6,279,133 | B1 | 8/2001 | Vafai et al. |
| 6,301,558 | B1 | 10/2001 | Isozaki |
| 6,405,338 | B1 | 6/2002 | Sinha et al. |
| 6,975,254 | B1 | 12/2005 | Sperschneider et al. |
| 7,058,132 | B1 | 6/2006 | Sebire et al. |
| 7,266,750 | B1 | 9/2007 | Patapoutian et al. |
| 7,356,748 | B2 * | 4/2008 | Taleb ........................ G06F 21/56 714/746 |
| 7,596,489 | B2 | 9/2009 | Kovesi et al. |
| 8,391,373 | B2 | 3/2013 | Virette et al. |
| 8,462,702 | B2 | 6/2013 | Jax et al. |
| 8,798,172 | B2 | 8/2014 | Oh et al. |
| 9,026,434 | B2 | 5/2015 | Greer et al. |
| 9,823,745 | B1 | 11/2017 | Fateh |
| 10,762,907 | B2 | 9/2020 | Tomasek et al. |
| 10,984,804 | B2 | 4/2021 | Lecomte et al. |
| 2002/0026616 | A1 | 2/2002 | Kikuchi et al. |
| 2002/0030612 | A1 | 3/2002 | Hetherington et al. |
| 2002/0072901 | A1 | 6/2002 | Bruhn |
| 2002/0080725 | A1 | 6/2002 | Bradley |
| 2002/0178418 | A1 | 11/2002 | Ramprashad et al. |
| 2003/0106009 | A1 | 6/2003 | Jarchi et al. |
| 2004/0128128 | A1 | 7/2004 | Wang et al. |
| 2005/0163234 | A1 | 7/2005 | Taleb |
| 2006/0104366 | A1 | 5/2006 | Huang et al. |
| 2006/0271355 | A1 | 11/2006 | Wang et al. |
| 2007/0065425 | A1 | 3/2007 | Behrens et al. |
| 2007/0086058 | A1 | 4/2007 | Ordentlich et al. |
| 2007/0121721 | A1 | 5/2007 | Kim et al. |
| 2007/0140359 | A1 | 6/2007 | Ehret et al. |
| 2007/0258651 | A1 | 11/2007 | Shin et al. |
| 2007/0271480 | A1 * | 11/2007 | Oh .................. G10L 19/005 714/3 |
| 2007/0282600 | A1 | 12/2007 | Ojanpera |
| 2008/0071530 | A1 | 3/2008 | Ehara |
| 2008/0111719 | A1 | 5/2008 | Sperschneider et al. |
| 2008/0126096 | A1 | 5/2008 | Oh et al. |
| 2008/0126904 | A1 | 5/2008 | Sung et al. |
| 2008/0133242 | A1 | 6/2008 | Sung et al. |
| 2008/0301536 | A1 | 12/2008 | Shin et al. |
| 2009/0030675 | A1 | 1/2009 | Liebchen |
| 2009/0076807 | A1 | 3/2009 | Xu et al. |
| 2009/0209636 | A1 | 8/2009 | Raederstorff et al. |
| 2009/0281797 | A1 | 11/2009 | Zopf et al. |
| 2010/0023830 | A1 | 1/2010 | Wengerter et al. |
| 2010/0040153 | A1 | 2/2010 | Imanaka et al. |
| 2010/0080305 | A1 | 4/2010 | Guo et al. |
| 2010/0115370 | A1 | 5/2010 | Laaksonen et al. |
| 2011/0026848 | A1 | 2/2011 | Ordentlich et al. |
| 2011/0075753 | A1 | 3/2011 | Jung et al. |
| 2011/0138258 | A1 | 6/2011 | Okamura et al. |
| 2011/0170711 | A1 * | 7/2011 | Rettelbach ............ G10L 19/028 381/98 |
| 2011/0173009 | A1 | 7/2011 | Fuchs et al. |
| 2011/0191111 | A1 * | 8/2011 | Chu .................. G10L 19/005 704/500 |
| 2011/0320901 | A1 | 12/2011 | Sato et al. |
| 2012/0271644 | A1 * | 10/2012 | Bessette ................. G10L 19/03 704/E19.035 |
| 2013/0187798 | A1 | 7/2013 | Marpe et al. |
| 2013/0254615 | A1 | 9/2013 | Vijayasankar et al. |
| 2013/0332152 | A1 | 12/2013 | Lecomte et al. |
| 2014/0012589 | A1 | 1/2014 | Oh et al. |
| 2014/0063062 | A1 | 3/2014 | Fateh |
| 2014/0142957 | A1 | 5/2014 | Sung et al. |
| 2014/0310010 | A1 | 10/2014 | Seo et al. |
| 2015/0142452 | A1 * | 5/2015 | Sung .................. G10L 19/025 704/500 |
| 2015/0181194 | A1 | 6/2015 | Izawa et al. |
| 2016/0171740 | A1 | 6/2016 | Yerli |
| 2016/0247506 | A1 | 8/2016 | Lecomte et al. |
| 2016/0266699 | A1 | 9/2016 | Zhao et al. |
| 2016/0285718 | A1 | 9/2016 | Bruhn |
| 2016/0322060 | A1 | 11/2016 | Riedmiller et al. |
| 2017/0004835 | A1 | 1/2017 | Schnabel et al. |
| 2017/0094295 | A1 | 3/2017 | Gu |
| 2017/0169833 | A1 | 6/2017 | Lecomte et al. |
| 2018/0026663 | A1 | 1/2018 | Wu et al. |
| 2018/0122386 | A1 | 5/2018 | Sung et al. |
| 2018/0234115 | A1 | 8/2018 | Noh et al. |
| 2018/0358023 | A1 | 12/2018 | Sasaki |
| 2019/0005965 | A1 | 1/2019 | Lecomte et al. |
| 2019/0005966 | A1 | 1/2019 | Lecomte et al. |
| 2019/0005967 | A1 | 1/2019 | Lecomte et al. |
| 2019/0051311 | A1 | 2/2019 | Sung et al. |

FOREIGN PATENT DOCUMENTS

| CN | 101174931 A | 5/2008 |
|---|---|---|
| CN | 101218630 A | 7/2008 |
| CN | 101261833 A | 9/2008 |
| CN | 101331733 A | 12/2008 |
| CN | 101569198 A | 10/2009 |
| CN | 102034478 A | 4/2011 |
| CN | 102057424 A | 5/2011 |
| CN | 102163430 A | 8/2011 |
| CN | 102165782 A | 8/2011 |
| CN | 103597544 A | 2/2014 |
| CN | 103688306 A | 3/2014 |
| CN | 104021769 A | 9/2014 |

(56) References Cited

FOREIGN PATENT DOCUMENTS

| CN | 104885149 A | 9/2015 |
|---|---|---|
| CN | 107077851 A | 8/2017 |
| CN | 108711431 A | 10/2018 |
| CN | 108885875 A | 11/2018 |
| CN | 109155133 A | 1/2019 |
| CN | 109313905 A | 2/2019 |
| EP | 0170328 A1 | 2/1986 |
| EP | 0732855 A2 | 9/1996 |
| EP | 0798888 A2 | 10/1997 |
| EP | 0936772 A2 | 8/1999 |
| EP | 1155498 B1 | 3/2004 |
| EP | 2270777 A2 | 1/2011 |
| EP | 3011559 B1 | 7/2017 |
| EP | 3230980 A1 | 10/2017 |
| GB | 2253123 A | 8/1992 |
| IN | 201637013771 A | 8/2016 |
| JP | H04219033 A | 8/1992 |
| JP | H06202696 A | 7/1994 |
| JP | H06204983 A | 7/1994 |
| JP | H1022937 A | 1/1998 |
| JP | H11317675 A | 11/1999 |
| JP | 2998254 B2 | 1/2000 |
| JP | 2000123083 A | 4/2000 |
| JP | 2000227756 A | 8/2000 |
| JP | 3328093 B2 | 9/2002 |
| JP | 2003289539 A | 10/2003 |
| JP | 2005006289 A | 1/2005 |
| JP | 2006287551 A | 10/2006 |
| JP | 2009276890 A | 11/2009 |
| JP | 2009538460 A | 11/2009 |
| JP | 2010503352 A | 1/2010 |
| JP | 2010511201 A | 4/2010 |
| JP | 4841789 B2 | 10/2011 |
| JP | 2012242785 A | 12/2012 |
| JP | 5186054 B2 | 1/2013 |
| JP | 2017097326 A | 6/2017 |
| KR | 10-2001-0108051 A | 12/2001 |
| KR | 20060094105 A | 8/2006 |
| KR | 20060101889 A | 9/2006 |
| KR | 10-2007-0110311 A | 11/2007 |
| KR | 10-2015-0099615 A | 8/2015 |
| RU | 2239950 C2 | 11/2004 |
| RU | 2408089 C9 | 4/2011 |
| RU | 2610588 C2 | 2/2017 |
| TW | 200743388 A | 11/2007 |
| TW | 201116058 A | 5/2011 |
| TW | 201248616 A | 12/2012 |
| TW | 201521016 A | 6/2015 |
| TW | 201528255 A | 7/2015 |
| TW | 201539433 A | 10/2015 |
| TW | 201724085 A | 7/2017 |
| TW | 201813322 A | 4/2018 |
| WO | 9711535 A1 | 3/1997 |
| WO | 03065755 A1 | 8/2003 |
| WO | 2005086436 A1 | 9/2005 |
| WO | 2007008007 A1 | 1/2007 |
| WO | 2007084475 A2 | 7/2007 |
| WO | 2010000303 A1 | 1/2010 |
| WO | 2010088625 A1 | 8/2010 |
| WO | 2010103607 A1 | 9/2010 |
| WO | 2011103678 A1 | 9/2011 |
| WO | 2012141486 A2 | 10/2012 |
| WO | 2012158159 A1 | 11/2012 |
| WO | 2014072260 A2 | 5/2014 |
| WO | 2016091893 A1 | 6/2016 |
| WO | 2017153006 A1 | 9/2017 |
| WO | 2017153299 A2 | 9/2017 |

OTHER PUBLICATIONS

3GPP TS 26.441, "Codec for Enhanced Voice Services (EVS); General Overview", 3GPP TS 26.441 V13.0.0 (Dec. 2015), Dec. 2015, 12 pp.

Boltze, Thomas, et al., "Audio services and applications 1 of 2", International Symposium on Digital Audio Broadcasting, No. ED. 2, XP003011836, Jan. 1, 2003, pp. 75-125.

Boltze, Thomas, et al., "Audio services and applications 2 of 2", International Symposium on Digital Audio Broadcasting, No. ED. 2, XP003011836, Jan. 1, 2003, pp. 75-125.

ETSI Standard, "[Part 1 of 13] Digital Radio Mondiale; System Specification", ETSI ES 201 980 V4.1.1 (Jan. 2014) (195 pp.), Jan. 2014, pp. 1-14.

ETSI Standard, "[Part 10 of 13] Digital Radio Mondiale; System Specification", ETSI ES 201 980 V4.1.1 (Jan. 2014) (195 pp.), Jan. 2014, pp. 139-154.

ETSI Standard, "[Part 11 of 13] Digital Radio Mondiale; System Specification", ETSI ES 201 980 V4.1.1 (Jan. 2014) (195 pp.), Jan. 2014, pp. 155-170.

ETSI Standard, "[Part 12 of 13] Digital Radio Mondiale; System Specification", ETSI ES 201 980 V4.1.1 (Jan. 2014) (195 pp.), Jan. 2014, pp. 171-187.

ETSI Standard, "[Part 13 of 13] Digital Radio Mondiale; System Specification", ETSI ES 201 980 V4.1.1 (Jan. 2014) (195 pp.), Jan. 2014, pp. 188-195.

ETSI Standard, "[Part 2 of 13] Digital Radio Mondiale; System Specification", ETSI ES 201 980 V4.1.1 (Jan. 2014) (195 pp.), Jan. 2014, pp. 15-26.

ETSI Standard, "[Part 3 of 13] Digital Radio Mondiale; System Specification", ETSI ES 201 980 V4.1.1 (Jan. 2014) (195 pp.), Jan. 2014, pp. 27-39.

ETSI Standard, "[Part 4 of 13] Digital Radio Mondiale; System Specification", ETSI ES 201 980 V4.1.1 (Jan. 2014) (195 pp.), Jan. 2014, pp. 40-54.

ETSI Standard, "[Part 5 of 13] Digital Radio Mondiale; System Specification", ETSI ES 201 980 V4.1.1 (Jan. 2014) (195 pp.), Jan. 2014, pp. 55-70.

ETSI Standard, "[Part 6 of 13] Digital Radio Mondiale; System Specification", ETSI ES 201 980 V4.1.1 (Jan. 2014) (195 pp.), Jan. 2014, pp. 71-83.

ETSI Standard, "[Part 7 of 13] Digital Radio Mondiale; System Specification", ETSI ES 201 980 V4.1.1 (Jan. 2014) (195 pp.), Jan. 2014, pp. 84-102.

ETSI Standard, "[Part 8 of 13] Digital Radio Mondiale; System Specification", ETSI ES 201 980 V4.1.1 (Jan. 2014) (195 pp.), Jan. 2014, pp. 103-120.

ETSI Standard, "[Part 9 of 13] Digital Radio Mondiale; System Specification", ETSI ES 201 980 V4.1.1 (Jan. 2014) (195 pp.), Jan. 2014, pp. 121-138.

ETSI TR, "ETSI TR 103590 V1.1.1 (Sep. 2018), "Digital Enhanced Cordless Telecommunications (DECT)", Study of Super Wideband Codec in DECT for narrowband, wideband and super-wideband audio communication including options of low delay audio connections (lower than 10 ms framing)", Sep. 2018.

Fairhurst, G, et al., "Smart Codec: An Adaptive Packet Data Link", IEE Proceedings: Communications, Institution of Electrical Engineers, GB, (Jun. 1, 1998), XP000766291, 1998, vol. 145, No. 3, pp. 180-185.

Jacaba, Joebert S, "Audio Compression Using Modified Discrete Cosine Transform—The MP3 Coding Standard—1 of 2", Undergraduate research paper, XP055359704, 2001, pp. 1-83.

Jacaba, Joebert S, "Audio Compression Using Modified Discrete Cosine Transform—The MP3 Coding Standard—2 of 2", Undergraduate research paper, XP055359704, 2001, pp. 1-83.

Lauber, Pierre, et al., "Error Concealment for Compressed Digital Audio", in Audio Engineering Society, XP008075936, Sep. 2001.

Moon, Todd K, "Error Correction Coding: Mathematical Methods and Algorithms", Wiley-Interscience, 2005, 2005, 39 pp.

Perkins, Colin, et al., "A Survey of Packet Loss Recovery Techniques for Streaming Audio", IEEE vol. 12, No. 5, XP000875014, 1998, pp. 40-48.

Rämö, Anssi, et al., "EVS Channel Aware Mode Robustness to Frame Erasures", in Interspeech 2016, San Francisco, CA, USA, 2016.

Rose, Kenneth, et al., "A Frame Loss Concealment Technique for MPEG-AAC", AES Convention 120, XP040507556, May 2006.

(56) References Cited

OTHER PUBLICATIONS

Rose, Kenneth, et al., "Frame Loss Concealment for Audio Decoders Employing Spectral Band Replication", AEL Convention 121, XP040507885, Oct. 2006.

Sperschneider, Ralph, et al., "Error Resilient Source Coding with Differential Variable Length Codes and its Application to MPEG Advance Audio Coding", Audio Engineering Societey, Munich, 2002, Sep. 22, 2000, 19 pp.

Taleb, Anisse, et al., "Partial Spectral Loss Concealment in Transform Coders", IEEE Conference on Acoustics, Speech, And Signal Processing, vol. 3, XP010792360, 2005, pp. 185-188.

Venkatraman, A, et al., "Improved Error Resilience for VoLTE and VoIP with 3GPP EVS Channel Aware Coding", in ICASSP, 2015.

3GPP, "Codec for Enhanced Voice Services (EVS)", General Overview. Technical specification, 2015.

Kamamoto, Yutaka, et al., "Trend of High sound quality audio coding technology for VoLTE", Journal of the Acoustic Society of Japan, vol. 74, No. 2, with English translation, pp. 83-92.

ETSI TS 102 563 digital audio broadcasting DAB: transport of advanced audio coding(AAC) audio Technical Specification; May 2010.

ISO/IEC, "Part 1 of 3—Information technology Coding of audio-visual objects, Part 3: Audio", ISO/IEC 14496-3—MPEG-4 Information technology, Standard, International Organization for Standardization, Geneva, CH, 2009, 1416 pp.

ETSI TS 102 563 V1.1.1, Digital Audio Broadcasting (DAB) Transport of Advanced Audio Coding (AAC) audio (Feb. 2007).

Hoeve, H, et al., "Fehlerkorrektur im Compact Disc Digital Audio-System", NTZ Nachrichtentechnische Zeitschrift, VDE Verlag GmbH, vol. 36, No. 7, XP009521920, pp. 446-448 (with English translation).

\* cited by examiner ure 1 US 12,039,986 B2

DECODER AND DECODING METHOD FOR LC3 CONCEALMENT INCLUDING FULL FRAME LOSS CONCEALMENT AND PARTIAL FRAME LOSS CONCEALMENT

CROSS-REFERENCES TO RELATED APPLICATIONS

This application is a continuation of copending International Application No. PCT/EP2020/053620, filed Feb. 12, 2020, which is incorporated herein by reference in its entirety, and additionally claims priority from European Applications Nos. EP 19156997.9, filed Feb. 13, 2019, EP 19157036.5, filed Feb. 13, 2019, EP 19157042.3, filed Feb. 13, 2019 and EP 19157047.2, filed Feb. 13, 2019 as well as from International Application Nos. PCT/EP2019/065172, filed Jun. 11, 2019, PCT/EP2019/065205, filed Jun. 11, 2019 and PCT/EP2019/065209, filed Jun. 11, 2019, all of which are incorporated herein by reference in their entirety The present invention relates to a decoder and a decoding method for LC3 frame loss concealment including full frame loss concealment and partial frame loss concealment.

BACKGROUND OF THE INVENTION

Transform based audio codecs rely on coded representations of spectra of audio frames. Such spectra consist of a plurality of spectral lines. Due to various reasons, either some or even all spectral lines may not be available on a decoder side. Audio error concealment concepts in the frequency domain may, e.g., provide means to mitigate artefacts caused by such missing spectral lines. A common approach is, to find as good as possible replacements for them.

In the prior art, various frame loss concealment techniques are available.

Frame loss concealment concepts in the frequency domain are, e.g., discussed in [1], where, in particular, muting, repetition, noise substitution and prediction are mentioned. Those techniques are always combined with a fade-out process, which fades the signal—usually over several lost frames—towards either zero or towards some sort of background noise/comfort noise.

In [2], different attenuation factors for frequency bands are proposed depending on the energy in those bands: A larger attenuation factor may, e.g., be applied for bands with an energy higher than a threshold, and a smaller attenuation factor might be applied for bands with an energy below that threshold. Moreover, in [2], the energy progression over the last good frames is observed, and a stronger attenuation is applied, if the energy in the last good frame was smaller than in the last but one good frame.

Furthermore, the spectral shape of the signal might also be faded towards some sort of common shape. This approach is used in particular in linear predictive coding (LPC) based codecs, e.g. EVS (enhanced voice services), where the LPC coefficients are blended towards some provided mean coefficients.

SUMMARY

An embodiment may have a decoder for decoding a current frame to reconstruct an audio signal, wherein the audio signal is encoded within the current frame, wherein the current frame includes a current bitstream payload, wherein the current bitstream payload includes a plurality of payload bits, wherein the plurality of payload bits encodes a plurality of spectral lines of a spectrum of the audio signal, wherein each of the payload bits exhibits a position within the current bitstream payload, the decoder having: a decoding module configured to reconstruct the audio signal, and an output interface configured to output the audio signal, wherein the decoding module includes an error concealment mode, wherein, if the decoding module is in said error concealment mode, the decoding module is configured to reconstruct the audio signal by conducting error concealment for those spectral lines of the spectrum of the audio signal, which exhibit a frequency being greater than a threshold frequency; and/or wherein, if error concealment is conducted by the decoding module, the decoding module is configured to conduct error concealment in a way that depends on whether or not a previous bitstream payload of a previous frame preceding the current frame encodes a signal component of the audio signal which is tonal or harmonic.

Another embodiment may have a method for decoding a current frame to reconstruct an audio signal, wherein the audio signal is encoded within the current frame, wherein the current frame includes a current bitstream payload, wherein the current bitstream payload includes a plurality of payload bits, wherein the plurality of payload bits encodes a plurality of spectral lines of a spectrum of the audio signal, wherein each of the payload bits exhibits a position within the bitstream payload, the method having the steps of: reconstructing the audio signal, wherein, in an error concealment mode, reconstructing the audio signal is conducted by conducting error concealment for those spectral lines of the spectrum of the audio signal, which exhibit a frequency being greater than a threshold frequency; and/or wherein, if error concealment is conducted, error concealment is conducted in a way that depends on whether or not a previous bitstream payload of a previous frame preceding the current frame encodes a signal component of the audio signal which is tonal or harmonic; and outputting the audio signal.

Another embodiment may have a non-transitory digital storage medium having a computer program stored thereon to perform the method for decoding a current frame to reconstruct an audio signal, wherein the audio signal is encoded within the current frame, wherein the current frame includes a current bitstream payload, wherein the current bitstream payload includes a plurality of payload bits, wherein the plurality of payload bits encodes a plurality of spectral lines of a spectrum of the audio signal, wherein each of the payload bits exhibits a position within the bitstream payload, the method having the steps of: reconstructing the audio signal, wherein, in an error concealment mode, reconstructing the audio signal is conducted by conducting error concealment for those spectral lines of the spectrum of the audio signal, which exhibit a frequency being greater than a threshold frequency; and/or wherein, if error concealment is conducted, error concealment is conducted in a way that depends on whether or not a previous bitstream payload of a previous frame preceding the current frame encodes a signal component of the audio signal which is tonal or harmonic; and outputting the audio signal, when said computer program is run by a computer.

A decoder for decoding a current frame to reconstruct an audio signal is provided. The audio signal is encoded within the current frame. The current frame comprises a current bitstream payload. The current bitstream payload comprises a plurality of payload bits. The plurality of payload bits encodes a plurality of spectral lines of a spectrum of the audio signal. Each of the payload bits exhibits a position within the current bitstream payload. The decoder comprises a decoding module and an output interface. The decoding module is configured to reconstruct the audio signal. The output interface is configured to output the audio signal. The decoding module comprises an error concealment mode, wherein, if the decoding module is in said error concealment mode, the decoding module is configured to reconstruct the audio signal by conducting error concealment for those spectral lines of the spectrum of the audio signal, which exhibit a frequency being greater than a threshold frequency. And/or, if error concealment is conducted by the decoding module, the decoding module is configured to conduct error concealment in a way that depends on whether or not a previous bitstream payload of a previous frame preceding the current frame encodes a signal component of the audio signal which is tonal or harmonic.

Moreover, a method for decoding a current frame to reconstruct an audio signal is provided. The audio signal is encoded within the current frame, wherein the current frame comprises a current bitstream payload, wherein the current bitstream payload comprises a plurality of payload bits. The plurality of payload bits encodes a plurality of spectral lines of a spectrum of the audio signal. Each of the payload bits exhibits a position within the current bitstream payload. The method comprises:

Reconstructing the audio signal, wherein, in an error concealment mode, reconstructing the audio signal is conducted by conducting error concealment for those spectral lines of the spectrum of the audio signal, which exhibit a frequency being greater than a threshold frequency; and/or, if error concealment is conducted, error concealment is conducted in a way that depends on whether or not a previous bitstream payload of a previous frame preceding the current frame encodes a signal component of the audio signal which is tonal or harmonic; and Outputting the audio signal.

Furthermore, a computer program for implementing the above-described method when being executed on a computer or signal processor is provided.

In some circumstances, error concealment concepts may, e.g., be be applied to the whole frame, e.g. if the whole frame is lost or marked as invalid, or—even if parts of the spectrum are available—if full frame loss concealment is considered to be the best possible error concealment strategy.

In other circumstances, however, error concealment techniques may, e.g., be applied to just a part of the frame, if parts of the spectrum are available.

Circumstances, where parts of the spectrum are available, may, for example, occur in scalable coding, e.g. AAC scalable, AAC SLS or BSAC, where some layers are received, but others are not received (AAC=advanced audio coding, SLS=scalable to lossless, BSAC=bit sliced arithmetic coding).

Or, parts of the spectrum may, e.g., be available in redundant frame coding, where a redundant low quality copy of the lost frame is available, i.e. in the context of VoIP or VoLTE (see, e.g., [3] and [4] for more information on robustness and error resilience in VoIP and VoLTE; VoIP=voice over IP/voice over internet protocol; VoLTE=voice over LTE/voice over long term evolution).

Or, parts of the spectrum may, e.g., be available when selective error detection is conducted, e.g. in AAC with RVLC (reversible variable length coding) for the scale factor data, where certain scale factors might be detected to be corrupt, leading to a certain number of corrupt spectra lines; or, e.g., in LC3 for DECT (digital enhanced cordless telecommunications), where errors in the coded representation of parts of the spectrum (representing the psychoacoustically less important spectral range) can be separately detected.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
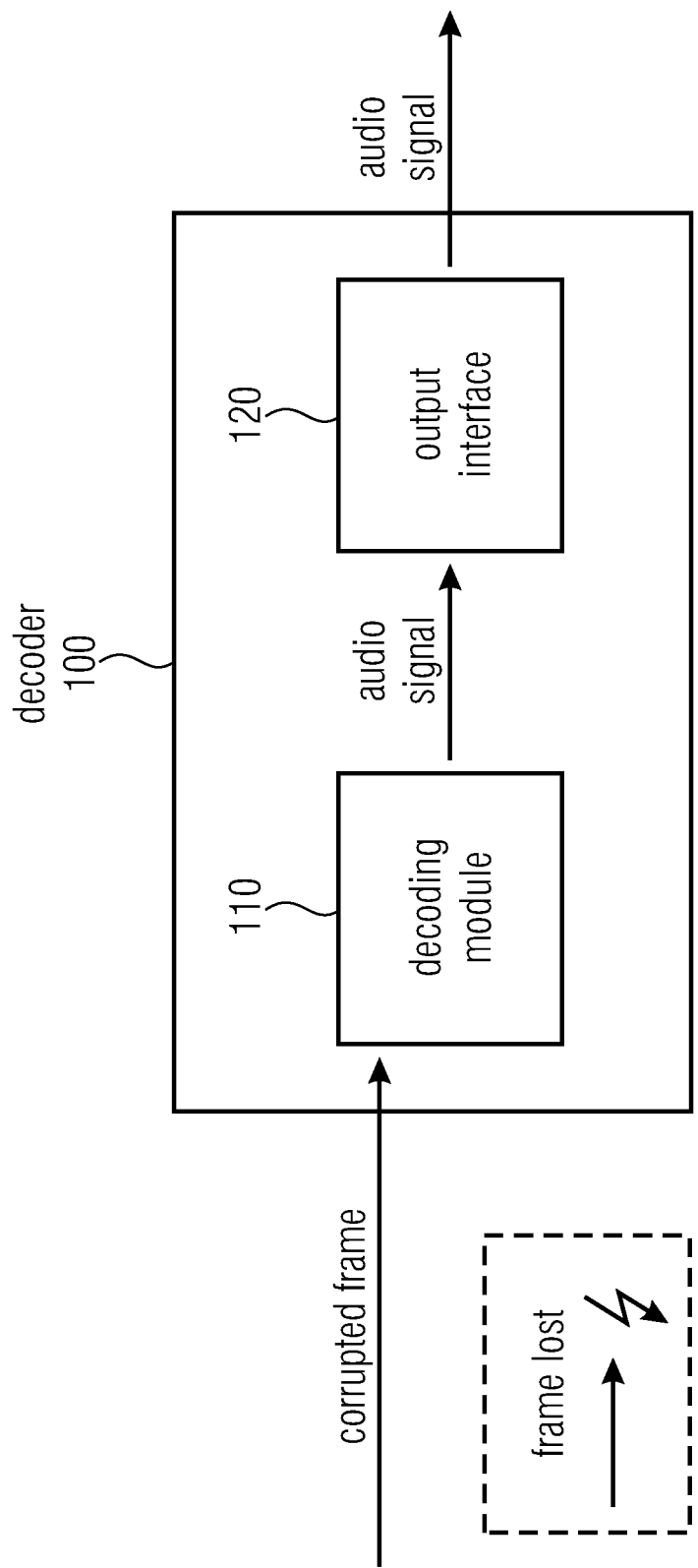
FIG. 1 illustrates a decoder for decoding a current frame to reconstruct an audio signal portion of an audio signal according to an embodiment.

FIG. 1 illustrates a decoder 100 for decoding a current frame to reconstruct an audio signal according to an embodiment.

The audio signal is encoded within the current frame. The current frame comprises a current bitstream payload. The current bitstream payload comprises a plurality of payload bits. The plurality of payload bits encodes a plurality of spectral lines of a spectrum of the audio signal. Each of the payload bits exhibits a position within the current bitstream payload.

The decoder 100 comprises a decoding module 110 and an output interface 120.

The decoding module 110 is configured to reconstruct the audio signal.

The output interface 120 is configured to output the audio signal.

The decoding module 110 comprises an error concealment mode, wherein, if the decoding module 110 is in said error concealment mode, the decoding module 110 is configured to reconstruct the audio signal by conducting error concealment for those spectral lines of the spectrum of the audio signal, which exhibit a frequency being greater than a threshold frequency.

And/or, if error concealment is conducted by the decoding module 110, the decoding module 110 is configured to conduct error concealment in a way that depends on whether or not a previous bitstream payload of a previous frame preceding the current frame encodes a signal component of the audio signal which is tonal or harmonic.

In some embodiments, the decoding module may, e.g., be in said error concealment mode, if the current bitstream payload of the current frame comprises uncorrectable errors and/or if the current frame is lost. The current bitstream payload may, e.g., comprise uncorrectable errors, if an error still exists after error correction has been conducted by the decoder 100; or, if the current bitstream payload comprises an error and no error correction is conducted at all. A frame comprising uncorrectable errors may, e.g., be referred to as a corrupted frame.

For example, according to an embodiment, particular error concealment parameters may, e.g., be configured depending on whether or not said previous bitstream payload of said previous frame preceding the current frame encodes said signal component of the audio signal which is tonal or harmonic.

According to an embodiment, the previous frame may, e.g., be a last received frame which has been decoded by the decoding module 110 without conducting error concealment in the full frame loss concealment mode.

In the following, embodiments are described in more detail.

The spectrum may, e.g., be considered to be subdivided into those spectral lines, which are available and which shall be used, and those spectral lines, which are not available or which shall not be used (for example, although they may, e.g., be available).

According to some embodiments, one may, e.g., proceed as follows:

In some situations, all spectral lines are available and shall be used, and thus, no frame loss concealment may, e.g., be conducted.

In other situations, certain spectral lines are available and shall be used, and partial frame loss concealment may, e.g., be conducted on the missing spectral lines.

In yet other situations, no spectral lines are available or shall be used, and full frame loss concealment may, e.g., be conducted.

In the following, error concealment depending on tonality according to some embodiments is described.

In an embodiment, if error concealment is conducted by the decoding module 110, the decoding module 110 may, e.g., be configured to reconstruct a current spectrum of the audio signal by conducting error concealment using a plurality of signs of a previous spectrum of the audio signal, said plurality of signs being encoded within the previous frame, wherein the decoding module 110 may, e.g., be configured to conduct error concealment in a way that depends on whether or not said previous frame encodes a signal component which is tonal or harmonic. For example, parameters for error concealment may, e.g., be selected in a different way depending on whether or not signal component which is tonal or harmonic.

In an embodiment, said previous frame may, e.g., be a last received frame, which has been decoded by the decoding module 110 without conducting error concealment. Or, said previous frame may, e.g., be a last received frame, which has been decoded by the decoding module 110 without conducting error concealment in the full frame loss concealment mode. Or, said previous frame may, e.g., be a last received frame, which has been decoded by the decoding module 110 without conducting error concealment in the partial frame loss concealment mode or in the full frame loss concealment mode.

According to an embodiment, if error concealment is conducted by the decoding module 110, and if the previous bitstream payload of the previous frame encodes a signal component which is tonal or harmonic, the decoding module 110 may, e.g., be configured to flip one or more signs of the plurality of signs of the previous spectrum to reconstruct the current spectrum, wherein a percentage value p, indicating a probability for a sign of the plurality of signs of the previous spectrum to be flipped by the decoding module 110 to reconstruct the current spectrum, may, e.g., be between $0\% \leq p \leq 50\%$, wherein the decoding module 110 may, e.g., be configured to determine the percentage value p. In an embodiment, the decoding module 110 may, e.g., employ a sequence of pseudo random numbers to determine whether a considered sign of the previous spectrum shall actually be flipped or not depending on the percentage value p.

In an embodiment, the decoding module 110 may, e.g., be configured to increase the percentage value p depending on a number of subsequent frames. Said number of subsequent frames may, e.g., indicate for how many subsequently (partially or fully) lost frames error concealment has been conducted by the decoding module 110; or wherein said number of subsequent frames may, e.g., indicate for how many subsequent frames error concealment in a particular error concealment mode has been conducted by the decoding module 110.

In an embodiment, the decoding module 110 may, e.g., be configured to determine the percentage value p depending on a function which depends on said number of subsequent frames, said number of subsequent frames being an argument of said function.

According to an embodiment, the decoding module 110 may, e.g., be configured to determine the percentage value p, such that p is 0%, if said number of subsequent frames is smaller than a first threshold value; such that $0\% \leq p \leq 50\%$, if said number of subsequent frames is greater than or equal to the first threshold value and smaller than a second threshold value, and such that p=50%, if said number of subsequent frames is greater than the second threshold value.

In an embodiment, the decoding module 110 may, e.g., be configured to determine the percentage value p, such that the percentage value p increases linearly in the range between the first threshold value and the second threshold value depending on the number of subsequent frames.

According to an embodiment, if error concealment is conducted by the decoding module 110, and if the previous bitstream payload of the previous frame does not encode a signal component which is tonal or harmonic, the decoding module 110 may, e.g., be configured to flip 50% of the plurality of signs of the previous spectrum to reconstruct the current spectrum.

In an embodiment, if error concealment is conducted by the decoding module 110, the decoding module 110 may, e.g., be configured to reconstruct a current spectrum of the audio signal by conducting error concealment using a plurality of amplitudes of the previous spectrum of the audio signal depending on whether or not the previous frame encodes a signal component which is tonal or harmonic, said plurality of amplitudes being encoded within the previous frame.

According to an embodiment, if error concealment is conducted by the decoding module 110, the decoding module 110 may, e.g., be configured to attenuate the plurality of amplitudes of the previous spectrum according to a non-linear attenuation characteristic to reconstruct the current spectrum, wherein the non-linear attenuation characteristic depends on whether or not the previous bitstream payload of the previous frame encodes a signal component which is tonal or harmonic. For example, parameters for the non-linear attenuation characteristic may, e.g., be selected in a different way depending on whether or not signal component which is tonal or harmonic.

In an embodiment, if error concealment is conducted by the decoding module 110, and if the previous bitstream payload of the previous frame encodes a signal component which is tonal or harmonic, the decoding module 110 may, e.g., be configured to attenuate the plurality of amplitudes of the previous spectrum depending on a stability factor, wherein said stability factor indicates a similarity between the current spectrum and the previous spectrum; or wherein the stability factor indicates a similarity between the previous spectrum and a pre-previous spectrum of a pre-previous frame preceding the previous frame.

According to an embodiment, said pre-previous frame may, e.g., be a last received frame before the previous frame, which has been decoded by the decoding module 110 without conducting error concealment. Or, said pre-previous frame may, e.g., be a last received frame before the previous frame (e.g., a last but one received frame), which has been decoded by the decoding module 110 without conducting error concealment in the full frame loss concealment mode. Or, said pre-previous frame may, e.g., be a last received frame before the previous frame, which has been decoded by the decoding module 110 without conducting error concealment in the partial frame loss concealment mode or in the full frame loss concealment mode.

In an embodiment, said stability factor may, e.g., indicate said similarity between the current spectrum and the previous spectrum, if the decoding module 110 is set to conduct partial frame loss concealment. Said stability factor may, e.g., indicate said similarity between the previous spectrum and the pre-previous spectrum, if the decoding module 110 is set to conduct full frame loss concealment.

According to an embodiment, the decoding module 110 may, e.g., be configured to determine an energy of a spectral bin of the previous spectrum. Moreover, the decoding module 110 may, e.g., be configured to determine whether or not said energy of said spectral bin is smaller than an energy threshold. If said energy is smaller than said energy threshold, the decoding module 110 may, e.g., be configured to attenuate an amplitude of the plurality of amplitudes being assigned to said spectral bin with a first fading factor. If said energy is greater than or equal to said energy threshold, the decoding module 110 may, e.g., be configured to attenuate said amplitude of the plurality of amplitudes being assigned to said spectral bin with a second fading factor, being smaller than the first fading factor. The decoding module 110 may, e.g., be configured to conduct attenuation such that by using a smaller fading factor for the attenuation of one of the plurality of amplitudes, the attenuation of said one of the amplitudes is increased.

In an embodiment, the decoding module 110 may, e.g., be configured to determine an energy of a spectral band comprising a plurality of spectral bins of the previous spectrum. The decoding module 110 may, e.g., be configured to determine whether or not said energy of said spectral band is smaller than an energy threshold. If said energy is smaller than said energy threshold, the decoding module 110 may, e.g., be configured to attenuate an amplitude of the plurality of amplitudes being assigned to said spectral bin of said spectral band with a first fading factor. If said energy is greater than or equal to said energy threshold, the decoding module 110 may, e.g., be configured to attenuate said amplitude of the plurality of amplitudes being assigned to said spectral bin of said spectral band with a second fading factor, being smaller than the first fading factor. The decoding module 110 may, e.g., be configured to conduct attenuation such that by using a smaller fading factor for the attenuation of one of the plurality of amplitudes, the attenuation of said one of the amplitudes is increased.

According to an embodiment, the decoding module 110 may, e.g., be configured to determine the first fading factor such that, depending on said number of subsequent frames, the first fading factor becomes smaller. Moreover, the decoding module 110 may, e.g., be configured to determine the second fading factor such that, depending on said number of subsequent frames, the second fading factor becomes smaller.

In an embodiment, the decoding module 110 may, e.g., be configured to determine the first fading factor and the second fading factor, so that $$\text{cum\_fading\_slow} = 1, \text{ and}$$
$$\text{cum\_fading\_fast} = 1,$$

if the current frame is a first frame among the subsequent frames, and so that if the current frame is one of the frames succeeding the first frame among the subsequent frames, the first fading factor and the second fading factor may, e.g., be determined depending on said number of subsequent frames according to:

$$\text{cum\_fading\_slow} = \text{cum\_fading\_slow} * \text{slow};$$
$$\text{cum\_fading\_fast} = \text{cum\_fading\_fast} * \text{fast};$$

wherein cum_fading_slow on the right side of the formula is the first fading factor of the previous frame (e.g., initialized with 1 at the first lost frame), wherein cum_fading_slow on the left side of the formula is the first fading factor of the current frame, wherein cum_fading_fast on the right side of the formula is the second fading factor of the previous frame (e.g., initialized with 1 at the first lost frame), wherein cum_fading_fast on the left side of the formula is the second fading factor of the current frame, wherein $1 > \text{slow} > \text{fast} > 0$.

According to an embodiment, $1 > \text{slow} > \text{fast} > 0.3$.

In an embodiment, the decoding module 110 may, e.g., be configured to determine said energy threshold, such that said energy threshold is equal to a first energy value, if said number of subsequent frames is smaller than a third threshold value; such that said energy threshold is smaller than said first energy value and is greater than a second energy value, if said number of subsequent frames is greater than or equal to the third threshold value and smaller than a fourth threshold value; and such that said energy threshold is equal to said second energy value, if said number of subsequent frames is greater than the fourth threshold value.

According to an embodiment, the decoding module 110 may, e.g., be configured to determine the energy threshold, such that the energy threshold decreases linearly in the range between the third threshold value and the fourth threshold value depending on the number of subsequent frames.

For those spectral lines, which are not available or which shall not be used, replacements are generated, whereas—depending on the tonality of the previously received signal, and, if this information is available, depending on the tonality of the currently received signal, a certain degree of tonality is preserved:

More tonality is preserved, if the indicator(s) indicate, that the last good signal was tonal.

Less tonality is preserved, if the indicator(s) indicate, that the last good signal was not tonal.

Tonality is mainly represented by the relationships of the phases between various bins within one frame and/or the relationships of the phases of the same bin for subsequent frames.

Some embodiments focus on the first aspect, namely that tonality is mainly represented by the relationships of the phases between various bins within one frame.

The phases of various bins within one frame are mainly characterized by their signs, but also by the relationship of the amplitude of neighbored bins. Hence, the preservation of the amplitude relationship as well as the preservation of the signs leads to a highly preserved tonality. Vice versa, the more the amplitude and/or the sign relationship is altered between subsequent bins, the less tonality is preserved.

Manipulation of the signs according to some of the embodiments is now described.

From the state of the art, two approaches are known:

According to a first approach, frame repetition is applied: The signs are preserved from the previous spectrum.

In a second approach, noise substitution is conducted: The signs are scrambled relative to the previous spectrum; randomly 50% of the signs are flipped.

For unvoiced signals, noise substitution provides good results.

For voiced signals, frame repetition could be used instead, but for longer losses, the preserved tonality (which is advantageous at the beginning of the loss) might become annoying.

Embodiments are based on the finding that for voiced signals a transition phase between frame repetition and noise substitution is desirable.

According to some embodiments, this may, e.g., be achieved by randomly flipping a certain percentage of the signs per frame, where this percentage lies between 0% and 50%, and is increasing over time.

Now, manipulation of the amplitude according to some embodiments is described.

The simplest way, being frequently used in the state of the art, is the application of a certain attenuation factor to all frequency bins. This attenuation factor is increased from frame to frame to achieve a smooth fade-out. The fade-out speed might be fix or may depend on signal characteristics. With this approach, the relationship of the magnitude of neighbored bins as well as the spectral shape of the whole frame is preserved.

Also known in the state of the art is a band wise attenuation using different attenuation factors depending on the energy within each band. While this approach also preserves the relationship of the magnitude of neighbored bins within each band, the spectral shape of the whole frame is flattened.

According to some embodiments, bins with larger values are attenuated stronger than bins with smaller values. For this, some embodiments may, e.g., define a non-linear attenuation characteristic. This non-linear attenuation characteristic prevents overshoots, which might otherwise occur, since no alias cancellation is assured during the overlap-add, and alters the relationship of the magnitude of neighbored bins, which results in a flatter spectral shape. In order to flatten the spectral shape. Some embodiments are based on the finding that the ratio of the magnitude of neighbored bins should stay above one, if it was above one beforehand; and that the ratio should stay below one, if it was below one beforehand.

In order to apply this attenuation gracefully, in some embodiments, the non-linear characteristic may, e.g., be small at the beginning of the loss and may, e.g., than subsequently be increased. In embodiments, its adjustment over time may, e.g., depend on the tonality of the signal: According to some embodiments, for unvoiced signals, the non-linearity may, e.g., be stronger than for voiced signals.

Such non-linear attenuation characteristic influences the spectral shape. In embodiments, the spectrum may, e.g., get flatter over time, which reduces the chance of annoying synthetic sound artefacts during burst losses.

In the following, partial frame loss concealment according to some embodiments is described.

According to an embodiment, said error concealment mode may, e.g., be a partial frame loss concealment mode, wherein, if the decoding module 110 is in the partial frame loss concealment mode, the decoding module 110 may, e.g., be configured to reconstruct the audio signal without conducting error concealment for one or more first spectral lines of the plurality of spectral lines of the spectrum, which exhibit a frequency being smaller than or equal to the threshold frequency, wherein said one or more first spectral lines have been encoded by a first group of one or more of the plurality of payload bits. Moreover, the decoding module 110 may, e.g., be configured to reconstruct the audio signal by conducting error concealment for one or more second spectral lines of the plurality of spectral lines of the spectrum, which exhibit a frequency being greater than the threshold frequency, wherein said one or more second spectral lines have been encoded by a second group of one or more of the plurality of payload bits.

In an embodiment, the decoding module 110 may, e.g., be configured to detect whether or not the current frame does not comprise any corrupted bits encoding said one or more first spectral lines of the spectrum of the audio signal which exhibit a frequency being smaller than or equal to the threshold frequency. Moreover, the decoding module 110 may, e.g., be configured to detect whether or not the current frame comprises one or more corrupted bits encoding said one or more second spectral lines of the spectrum of the audio signal which exhibit a frequency being greater than the threshold frequency. Said one or more corrupted bits are one or more of the payload bits that are distorted or that are likely to be distorted. If the current frame does not comprise any corrupted bits encoding said one or more first spectral lines of the spectrum of the audio signal which exhibit a frequency being smaller than or equal to the threshold frequency and if the current frame comprises said one or more corrupted bits encoding said one or more second spectral lines of the spectrum of the audio signal which exhibit a frequency being greater than the threshold frequency, the decoding module 110 may, e.g., be configured to conduct error concealment in the partial frame loss concealment mode by conducting error concealment for said one or more second spectral lines of the spectrum which are greater than the threshold frequency.

According to an embodiment, if the current frame does not comprise any corrupted bits encoding said one or more first spectral lines of the spectrum of the audio signal which exhibit a frequency being smaller than or equal to the threshold frequency and if the current frame comprises said one or more corrupted bits encoding said one or more second spectral lines of the spectrum of the audio signal which exhibit a frequency being greater than the threshold frequency, the decoding module 110 may, e.g., be configured to reconstruct the audio signal by decoding said first group of said one or more of the plurality of payload bits which encode said one or more first spectral lines of the spectrum of the audio signal which exhibit a frequency being smaller than or equal to the threshold frequency.

In an embodiment, the decoding module 110 may, e.g., be configured to detect whether the current frame is lost, wherein, if the decoder 100 has detected that the current frame is lost, the decoding module 110 may, e.g., be configured to reconstruct the audio signal by conducting error concealment for said one or more second spectral lines of the spectrum of the audio signal which exhibit a frequency being greater than the threshold frequency. Moreover, the decoding module 110 may, e.g., be configured to decode without conducting error concealment for said first group, said first group of said one or more of the plurality of payload bits which encode said one or more first spectral lines for said one or more first frequencies of the spectrum of the audio signal being smaller than or equal to the threshold frequency, wherein said first group of said one or more of the plurality of payload bits are one or more payload bits of a redundant frame being different from the current frame.

In an embodiment, the redundant frame may, e.g., be a bandwidth limited version of the current frame. For example, the redundant frame may, e.g., provide data (e.g., a reduced data set compared to the current frame) that encodes the audio signal for a same time period as the current frame. This data may, e.g., be different for the plurality of payload bits which encodes the audio signal of said one or more first spectral lines for said one or more first frequencies of the spectrum of the audio signal being smaller than or equal to the threshold frequency as they are encoded with less bits than the current frame of said first frequencies of the spectrum for the same time period of the current frame.

In an embodiment, if the decoding module 110 is configured to conduct error concealment in a full frame loss concealment mode, the decoding module 110 is configured to conduct error concealment for all spectral lines of the (whole) spectrum (as otherwise reconstructable by all payload bits of the current bitstream payload of the current frame).

According to an embodiment, the plurality of payload bits is a plurality of current payload bits. If the decoding module 110 is in the partial frame loss concealment mode, the decoding module 110 may, e.g., be configured to conduct error concealment for said one or more second spectral lines of the spectrum of the audio signal which exhibit a frequency being greater than the threshold frequency, using one or more stored spectral lines which have been encoded by one or more previous payload bits of the previous bitstream payload of the previous frame.

In an embodiment, the spectrum may, e.g., be a current quantized spectrum. If the decoding module 110 is conducting error concealment in the partial frame loss concealment mode, the decoding module 110 may, e.g., be configured to conduct error concealment for said one or more second spectral lines of the spectrum of the audio signal which exhibit a frequency being greater than the threshold frequency, to obtain one or more intermediate spectral lines of said current quantized spectrum.

According to an embodiment, the spectrum is a current quantized spectrum. If the decoding module 110 is conducting error concealment in the partial frame loss concealment mode, the decoding module 110 may, e.g., be configured to conduct error concealment for said one or more second spectral lines of the spectrum of the audio signal which exhibit a frequency being greater than the threshold frequency, to obtain one or more intermediate spectral lines of said current quantized spectrum, wherein the decoding module 110 may, e.g., be configured to rescale the one or more intermediate spectral lines using a rescaling factor to reconstruct the audio signal.

In an embodiment, the decoding module 110 may, e.g., be configured to determine the rescaling factor depending on at least one of
- a global gain being encoded within said current bitstream payload and
- a global gain being encoded within said previous bitstream payload, and
- an energy of a previous quantized spectrum of said previous frame, an energy of a previous decoded spectrum of said previous frame, and
- an energy of said current quantized spectrum of said current frame.

According to an embodiment, the decoding module 110 may, e.g., be configured to determine the rescaling factor depending on whether or not
- a mean energy of spectral bins of the previous decoded spectrum of the previous frame starting from a first spectral bin that cannot be reconstructed without conducting error concealment up to a top of the spectrum is greater than or equal to a mean energy of spectral bins of the previous decoded spectrum of the previous frame starting from zero up to said last spectral bin that can be reconstructed without conducting error concealment, or
- an energy of spectral bins of said current quantized spectrum of the current frame starting from zero up to said last spectral bin that can be reconstructed without conducting error concealment is greater than or equal to an energy of spectral bins of the previous quantized spectrum of the previous frame starting from zero up to said last spectral bin that can be reconstructed without conducting error concealment.

In an embodiment,
- if the mean energy of the spectral bins of the previous decoded spectrum of the previous frame starting from said first spectral bin that cannot be reconstructed without conducting error concealment up to a top of the spectrum is smaller than the mean energy of the spectral bins of the previous decoded spectrum of the previous frame starting from zero up to said last spectral bin that can be reconstructed without conducting error concealment, and
- if the energy of spectral bins of said current quantized spectrum of the current frame starting from zero up to said last spectral bin that can be reconstructed without conducting error concealment is smaller than the energy of the spectral bins of the previous quantized spectrum of the previous frame starting from zero up to said last spectral bin that can be reconstructed without conducting error concealment,
- the decoding module 110 may, e.g., be configured to determine the rescaling factor such that the rescaling factor is equal to the square root of the ratio of
- the energy of the spectral bins of the current quantized spectrum starting from zero up to said last spectral bin that can be reconstructed without conducting error concealment multiplied with the square of a gain factor of the current frame,
- to
- the energy of the spectral bins of the previous quantized spectrum starting from zero up said last spectral bin that can be reconstructed without conducting error concealment multiplied with the square of a gain factor of the previous frame.

According to an embodiment, the decoding module 110 may, e.g., be configured to determine the rescaling factor, being a total rescaling factor, depends on a global gain rescaling factor, wherein the decoding module 110 may, e.g., be configured to determine the global gain rescaling factor according to $$fac_{gg} = \frac{gg_{prev}}{gg}.$$

wherein gg indicates a global gain of the current frame, and wherein $gg_{prev}$ indicates a global gain of said previous frame, and wherein $fac_{gg}$ is the global gain rescaling factor.

In an embodiment, $$\text{if } \frac{1}{k_{be}}\sum_{k=0}^{k_{be}-1} \hat{X}_{prev}(k)^2 \leq \frac{1}{N_F - k_{be}}\sum_{k=k_{be}}^{N_F-1} \hat{X}_{prev}(k)^2,$$

or $$\text{if } gg_{prev}^2 \cdot \sum_{k=0}^{k_{be}-1} \widetilde{X_{q,lG}}(k)^2 \leq gg^2 \cdot \sum_{k=0}^{k_{be}-1} \widehat{X_q}(k)^2,$$

the decoding module 110 may, e.g., be configured to determine that the total rescaling factor is equal to the global gain rescaling factor, wherein k indicates a spectral bin, wherein $k_{be}$ indicates a first spectral bin that could not be recovered, wherein $N_F$ indicates a number of spectral lines, wherein $\widetilde{X_{q,lG}}(k)$ indicates the previous quantized spectrum of the previous frame being a last non-full frame loss concealment frame, wherein $\widehat{X_q}(k)$ indicates the current quantized spectrum of the current frame, wherein $\hat{X}_{prev}(k)$ indicates the previous decoded spectrum of the previous frame being said last non-full frame loss concealment frame.

According to an embodiment, $$\text{if } \frac{1}{k_{be}}\sum_{k=0}^{k_{be}-1} \hat{X}_{prev}(k)^2 > \frac{1}{N_F - k_{be}}\sum_{k=k_{be}}^{N_F-1} \hat{X}_{prev}(k)^2, \text{ and}$$

$$\text{if } gg_{prev}^2 \cdot \sum_{k=0}^{k_{be}-1} \widetilde{X_{q,lG}}(k)^2 > gg^2 \cdot \sum_{k=0}^{k_{be}-1} \widehat{X_q}(k)^2,$$

the decoding module 110 may, e.g., be configured to determine that the total rescaling factor moreover depends on an energy rescaling factor $$fac_{ener} = \sqrt{\frac{gg^2 \cdot \sum_{k=0}^{k_{be}-1} \widehat{X_q}(k)^2}{gg_{prev}^2 \cdot \sum_{k=0}^{k_{be}-1} \widetilde{X_{q,lG}}(k)^2}},$$

which may, e.g., be employed to form the total rescaling factor $$fac = fac_{gg} \cdot fac_{ener} = \sqrt{\frac{\sum_{k=0}^{k_{be}-1} \widehat{X_q}(k)^2}{\sum_{k=0}^{k_{be}-1} \widetilde{X_{q,lG}}(k)^2}}.$$

wherein $fac_{ener}$ indicates the energy rescaling factor, wherein k indicates a spectral bin, wherein $k_{be}$ indicates a first spectral bin that could not be recovered, wherein $N_F$ indicates a number of spectral lines, wherein $\widetilde{X_{q,lG}}(k)$ indicates the previous quantized spectrum of the previous frame being a last non-full frame loss concealment frame, wherein $\widehat{X_q}(k)$ indicates the current quantized spectrum of the current frame, wherein $\hat{X}_{prev}(k)$ indicates the previous decoded spectrum of the previous frame being said last non-full frame loss concealment frame.

In a scenario, where partial frame loss concealment is applied, it is assumed or it has been determined that the more sensitive bits of the bitstream payload were error-free.

In embodiments, the quantized spectrum $\widehat{X_q}(k)$ of the current frame may, e.g., be restored up to a certain frequency bin, here referred to as frequency bin $k_{be}-1$. Partial frame loss concealment thus just conceals the quantized spectral lines above this frequency.

When conducting partial frame loss concealment according to some embodiments, the spectral lines of the quantized spectrum of the last non-FFLC frame $\widetilde{X_{q,lG}}(k)$ may, e.g., be reused (FFLC=full frame loss concealment).

To prevent high-energy artefacts in transition frames changing in energy, the concealed spectral lines are subsequently rescaled, whereas the resulting rescaling factor may, e.g., depend on at least one of
 a) global gains;
 b) energies of the spectra;

Advantageously, the resulting rescaling factor may, e.g., depend on both global gains and energies of the spectra.

The rescaling factor based on the global gains equals the ratio of the previous global gain to the current global gain.

The rescaling factor based on the energies is initialized with 1 (e.g., no rescaling is conducted/e.g., rescaling has no effect):
 If the mean energy of the spectral bins of the previous decoded spectrum starting from the frequency bin $k_{be}$ (a first spectral bin that cannot be reconstructed without conducting error concealment) up to the top of the spectrum is larger or equal than the mean energy of the spectral bins of the previous decoded spectrum starting from zero up to the frequency bin $k_{be}-1$ (a last spectral bin that can be reconstructed without conducting error concealment); or
 If the energy of the spectral bins of the current quantized spectrum starting from zero up to the frequency bin $k_{be}-1$ is larger than or equal to the energy of the spectral bins of the previous quantized spectrum starting from zero up to the frequency bin $k_{be}-1$.

Otherwise, the rescaling factor equals the square root of the ratio of
 The energy of the spectral bins of the current quantized spectrum starting from zero up to the frequency bin $k_{be}-1$ multiplied with the square of the gain factor of the current frame; to
 the energy of the spectral bins of the previous quantized spectrum starting from zero up to the frequency bin $k_{be}-1$ multiplied with the square of the gain factor of the previous frame.

When multiplying both factors in this case, the gain factors cancel each other out. Thus, the rescaling factor subsequently equals the square root of the ratio of The energy of the spectral bins of the current quantized spectrum starting from zero up to the frequency bin $k_{be}-1$; to the energy of the spectral bins of the previous quantized spectrum starting from zero up to the frequency bin $k_{be}-1$.

After that, the concealed quantized spectrum may, e.g., be handled as an error-free quantized spectrum. This means the subsequent decoder operations like noise filling, noise shaping or any other operations whose parameters are stored in the error-free bitstream payload may, e.g., be applied afterwards. Thus, possible concealing artefacts are mitigated.

Subsequently, a similar fading process as described above may, for example, be applied on the spectrum starting from the frequency bin $k_{be}$ up to the top of the spectrum, for example, a possibly available tonal character may, e.g., be faded towards noise; and/or, for example, a possibly pronounced spectral shape may, e.g., be flattened; and/or the energy may, e.g., be decreased.

In the following, embodiments are described in detail.

Figure 2:
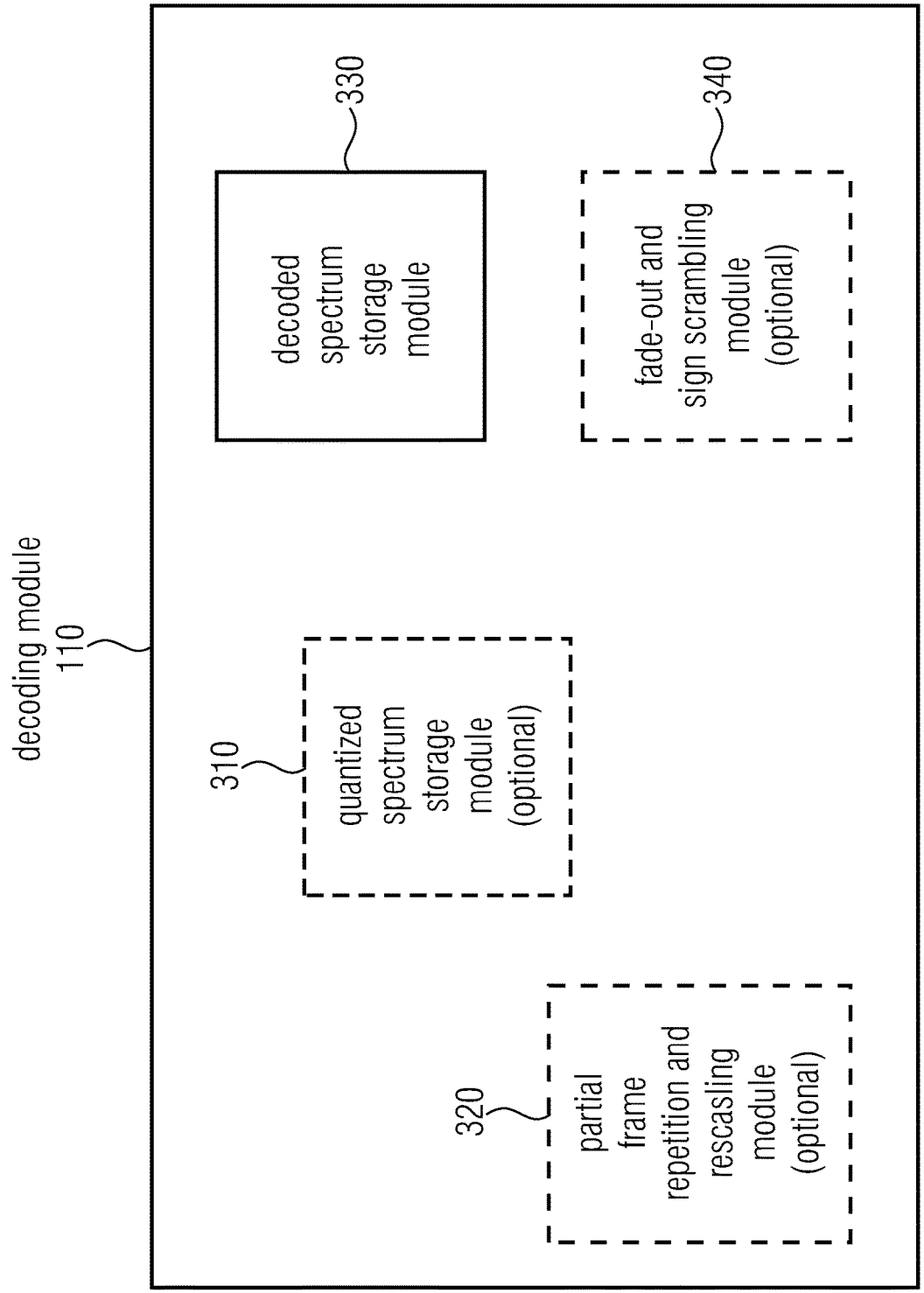
FIG. 2 illustrates a decoding module according to a particular embodiment.

FIG. 2 illustrates a decoding module 110 according to particular embodiments.

The decoding module 110 of FIG. 2 comprises a decoded spectrum storage module 330, and, optionally, a quantized spectrum storage module 310, a partial frame repetition & rescaling module 320 and a fade-out and sign scrambling module 340. Particular details of these (sub)modules of the specific decoding module 110 of FIG. 2 are described with reference to FIG. 3-FIG. 5.

Figure 3:
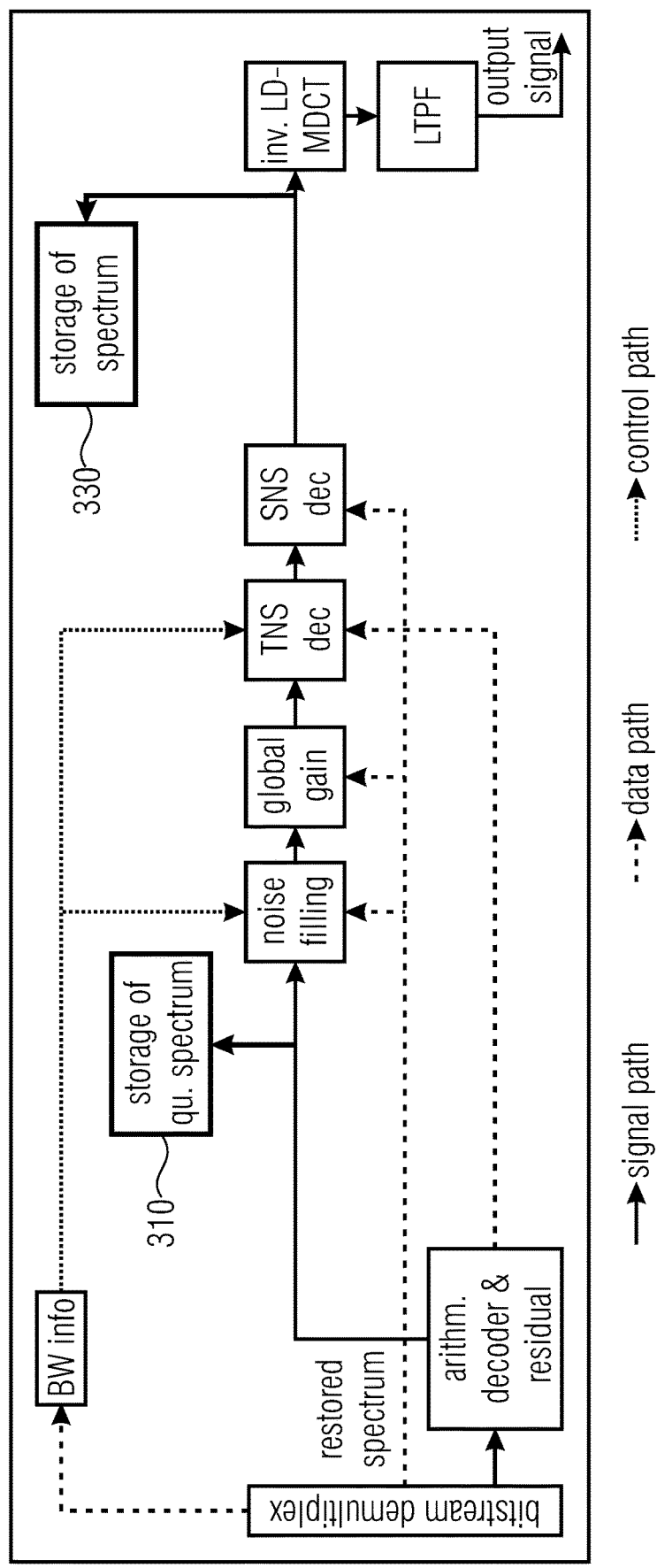
FIG. 3 illustrates a decoding module overview according to an embodiment for clean channel decoding.
Figure 4:
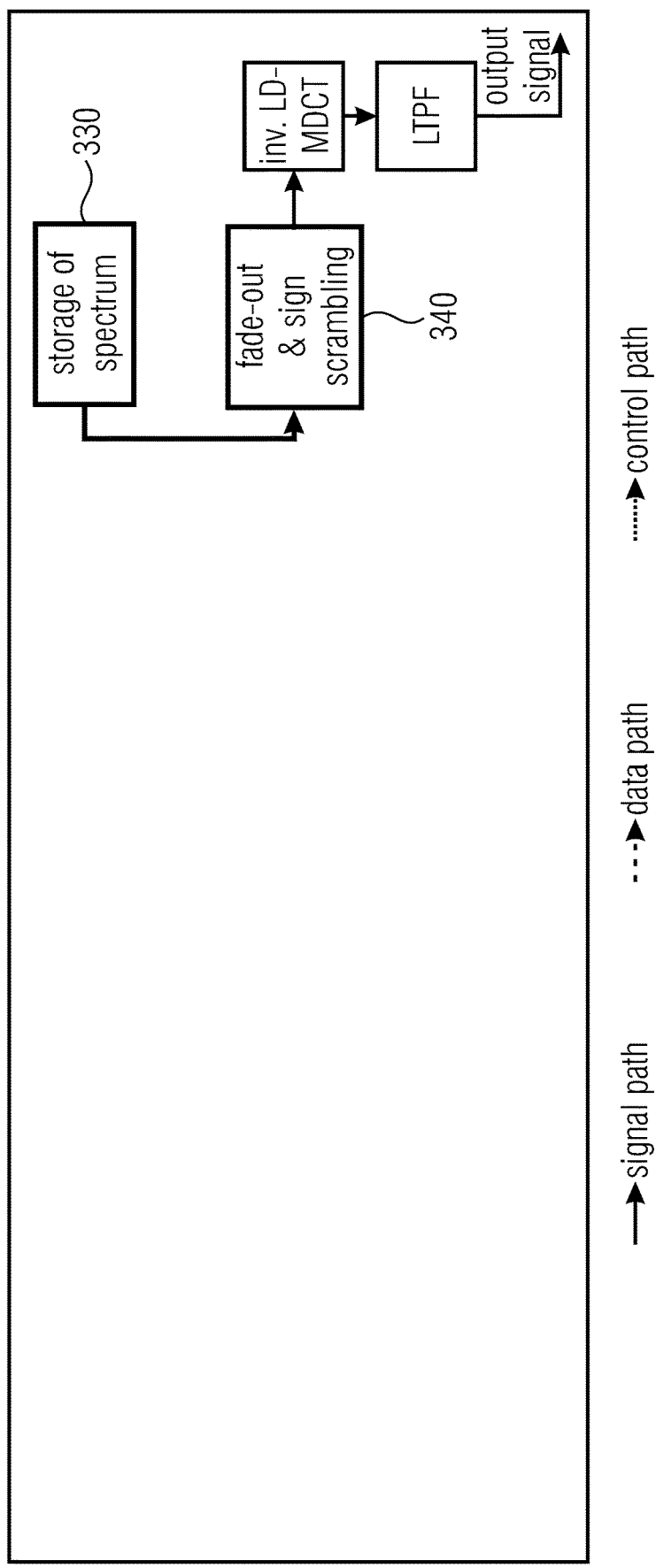
FIG. 4 illustrates a decoding module overview according to an embodiment for full frame loss concealment.
Figure 5:
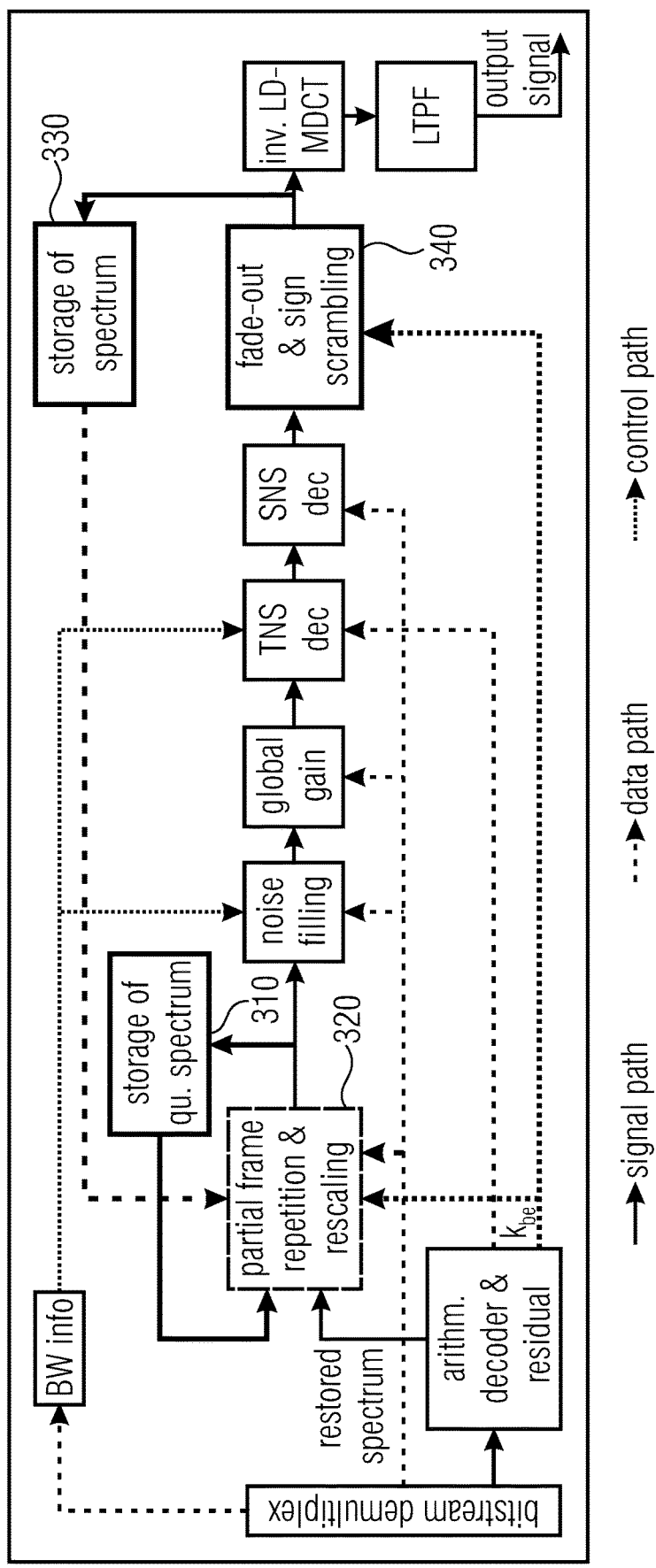
FIG. 5 illustrates a decoding module overview according to an embodiment for partial frame loss concealment.

FIG. 3-FIG. 5 provide high-level overview of the LC3 decoder (exemplarily used as state-of-the-art transform coder that is modified in inventive ways) according to embodiments. In particular, FIG. 3-FIG. 5 provide different kinds of specific embodiments for a decoding module 110.

In an embodiment, the decoding module 110 may, e.g., comprise a quantized spectrum storage module 310 configured for storing a quantized spectrum of the audio signal, wherein the quantized spectrum storage module 310 is configured to provide a last non-full frame loss concealment quantized spectrum. Moreover, the decoding module 110 may, e.g., comprise a decoded spectrum storage module 330 configured for storing a decoded spectrum of the audio signal, wherein the decoded spectrum storage module 330 is configured to provide a last non-full frame loss concealment decoded spectrum.

FIG. 3 illustrates a decoding module 110 overview according to an embodiment for clean channel decoding. In particular, FIG. 3 shows the normal decoder operation. The processing blocks that may be used for the full frame loss concealment as well as for the partial frame loss concealment are processing blocks 310 and 330.

The quantized spectrum storage module 310 may, e.g., be configured for the storage of the quantized spectrum: The quantized spectrum storage module 310 stores the last non-FFLC quantized spectrum to allow its re-usage in the case of partial frame loss concealment.

The decoded spectrum storage module 330 is configured for the storage of the spectrum (e.g., referred to as the decoded spectrum): This processing block stores the last non-FFLC spectrum to allow its re-usage in the case of full frame loss concealment. It may, e.g., also be used for the rescaling during the partial frame loss concealment.

In an embodiment, the decoding module 110 may, e.g., comprise a decoded spectrum storage module 330 configured for storing a decoded spectrum of the audio signal, wherein the decoded spectrum storage module 330 is configured to provide a last non-full frame loss concealment decoded spectrum. Moreover, the decoding module 110 may, e.g., comprise a fade-out and sign scrambling module 340 being configured for fade-out and sign scrambling on spectral lines of the spectrum.

In addition, according to an embodiment, the decoding module 110 may, e.g., comprise a quantized spectrum storage module 310 configured for storing a quantized spectrum of the audio signal, wherein the quantized spectrum storage module 310 is configured to provide a last non-full frame loss concealment quantized spectrum. Furthermore, the decoding module 110 may, e.g., be comprise a partial frame repetition & rescaling module 320 configured for partial frame repetition and rescaling, wherein the partial frame repetition & rescaling module 320 is configured to complement the spectrum by adding spectral lines, which could not be decoded by the decoding module 110, wherein the partial frame repetition & rescaling module 320 is configured to re-scale said spectral lines.

FIG. 4 illustrates a decoding module 110 overview according to an embodiment for full frame loss concealment. In particular, FIG. 4 depicts an embodiment configured for conducting full frame loss concealment. The processing blocks that may be used for the full frame loss concealment are processing blocks 330 and 340. Processing blocks 330 and 340 may, e.g., have the following tasks:

The decoded spectrum storage module 330 may, e.g., be configured for the storage of the spectrum (e.g., again referred to as the decoded spectrum): This processing block 330 provides the last non-FFLC spectrum.

The fade-out and sign scrambling module 340 may, e.g., be configured for fade-out and sign scrambling: This processing block is configured to create the spectrum by processing the spectral lines of the last non-FFLC frame, as described below.

FIG. 5 illustrates a decoding module 110 overview according to an embodiment for partial frame loss concealment.

In particular, FIG. 5 shows the application of partial frame loss concealment. The processing blocks that may be used for the partial frame loss concealment are processing blocks 310, 320, 330 and 340. These processing blocks 310, 320, 330 and 340 have the following tasks:

The quantized spectrum storage module 310 may, e.g., be configured for the storage of the quantized spectrum: The quantized spectrum storage module 310 may, e.g., be configured to provide the last non-FFLC quantized spectrum.

The partial frame repetition & rescaling module 320 may, e.g., be configured for partial frame repetition and rescaling: This processing block may, e.g., be configured to complement the spectrum by adding those spectral lines, which could not be decoded. Afterwards, those spectral lines may, e.g., be re-scaled and values below a certain threshold are quantized to zero, as explained below.

The decoded spectrum storage module 330 may, e.g., be configured for the storage of the spectrum (e.g., again referred to as the decoded spectrum): The decoded spectrum storage module 330 may, e.g., be configured to provide the last non-FFLC spectrum, which may, e.g., be used for computing the rescaling factor.

The fade-out and sign scrambling module 340 may, e.g., be configured for fade-out and sign scrambling: The fade-out and sign scrambling module 340 may, e.g., be configured to process the spectral lines, which were previously provided by the partial frame loss concealment. It is explained below.

In the following, error concealment depending on tonality according to some embodiments is described in more detail.

At first, a fading function according to some embodiments is provided.

For the fading processes implemented for the sign scrambling and the non-linear attenuation as described below, a function depending on the number of subsequently lost frames (nbLostFramesInRow) may, e.g., be employed, that is one (1) up to a certain value (plc_start_inFrames), that is zero (0) from a certain value (plc_end_inFrames); and that decreases linearly between one and zero (1>x>0) between plc_start_inFrames and plc_end_inFrames.

A particular embodiment may, e.g., be implemented as follows:

```
plc_duration_inFrames = plc_end_inFrames – plc_start_inFrames;
x = max(plc_start_inFrames, (min (nbLostFramesInRow, plc_end_inFrames)));
m = –1 / plc_duration_inFrames;
b = – plc_end_inFrames;
linFuncStartStop = m * (x + b);
``` where:
plc_start_inFrames—number of subsequently lost frames, up to which the value of linFuncStartStop equals 1
plc_end_inFrames—number of subsequently lost frames, from which the value of linFuncStartStop equals 0
linFuncStartStop—value of fading function The start value and the end value might be chosen differently depending on the signal characteristic (e.g. voiced vs. unvoiced) and depending on the frame loss concealment (e.g. PFLC vs. FFLC) (PFLC=partial frame loss concealment; FFLC=full frame loss concealment).

Figure 6:
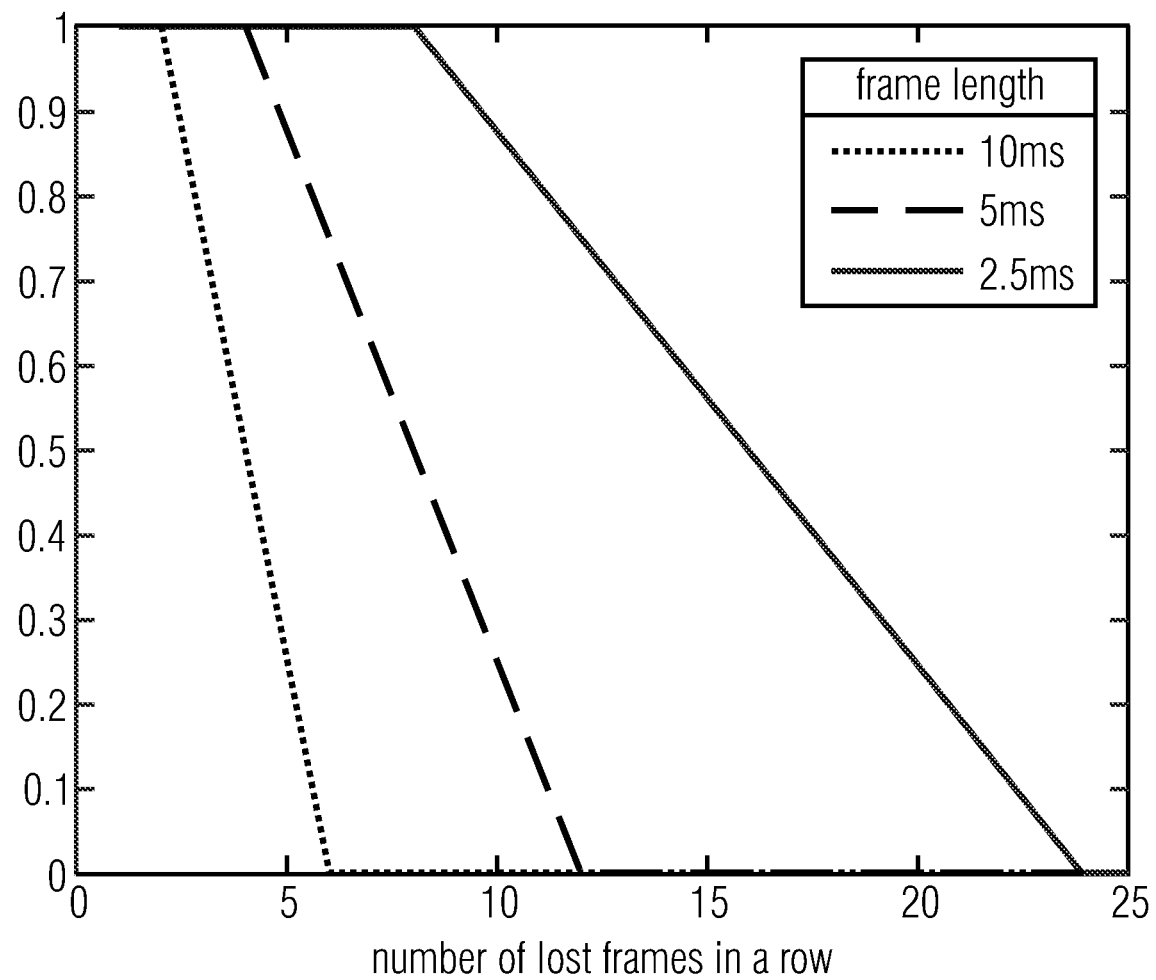
FIG. 6 illustrates a fading function according to an embodiment which depends on a number of lost frames in a row, and which further depends on a frame length.

FIG. 6 illustrates a fading function according to an embodiment which depends on a number of lost frames in a row (a number of subsequently lost frames).

In particular, FIG. 6 provides an example of this fading function, which is configured to decrease linearly between 20 ms and 60 ms.

In the following, manipulation of signs according to some embodiments is described in more detail.

Figure 7:
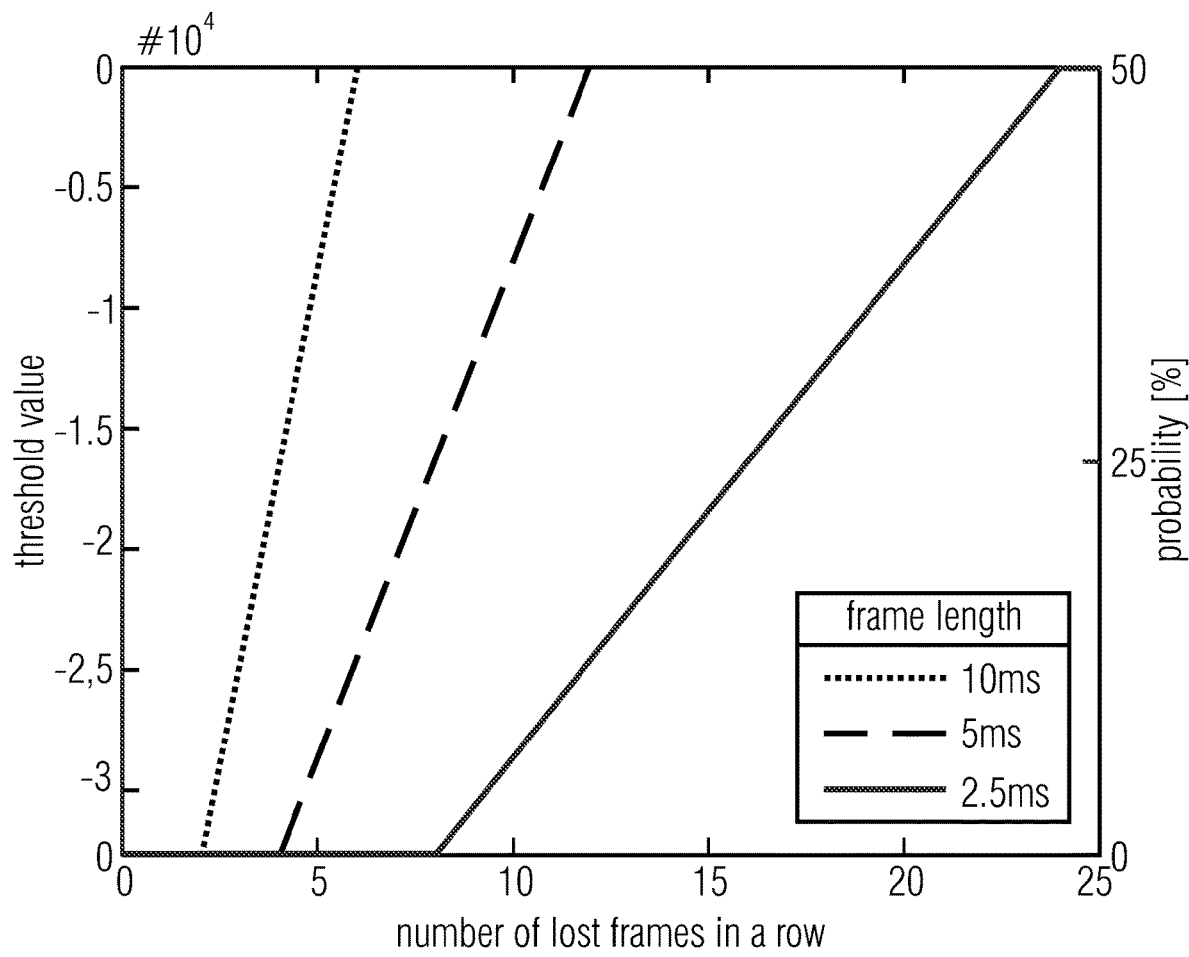
FIG. 7 illustrates a threshold for sign scrambling according to an embodiment, which depends on a number of lost frames in a row and which further depends on a frame length.

As a prerequisite, a threshold for sign scrambling may, e.g., be determined based on the fading value (linFuncStartStop) as derived above.

randThreshold=–32768*linFuncStartStop;

FIG. 7 illustrates a threshold for sign scrambling according to an embodiment, which depends on a number of lost frames in a row (a number of subsequently lost frames) and which further depends on a frame length.

In particular, FIG. 7 provides an example for a threshold which depends on a number of consecutively lost frames using the fading function, where a threshold of 0 corresponds to 50% sign flipping, whereas a threshold of –32768 corresponds to 0% sign flipping.

An embodiment may, e.g., be realized by the following pseudo code:

```
for k=k_be .. N_F – 1
    seed = 16831+seed*12821;
    seed = seed-round(seed*2^-16)*2^16;
    if seed==32768
        seed=–32768;
    end
    if (seed < 0 && pitch_present == 0) || seed < randThreshold
        spec(k) = –spec_prev(k);
    else
        spec(k) = spec_prev(k);
    end
end
``` where:
k—spectral bin
$k_{be}$—first spectral bin which could not be recovered
$N_F$—number of spectral lines
seed—random value with the exemplary initial value of 24607
pitch_present—information, whether the signal in the current frame is tonal
spec_prev(k)—spectral value of bin k in last good frame (also referred to as $\hat{X}_{prev}(k)$)
spec(k)—spectral value of bin k in current frame.

In this example, the seed (i.e. the random value) varies between 32768 and –32768. For unvoiced signals (pitch_present=0), the threshold for the sign inversion is zero, which leads to a 50% probability. For voiced signals, a variable threshold (randThreshold) is applied, which lies between –32768 (0% probability of sign inversion) and zero (50% probability of sign inversion).

In the following, a manipulation of the amplitude according to some embodiments is described in more detail.

In a particular embodiment, two attenuation factors may, e.g., be defined depending on a stability measure, for example, as follows:

```
slow = 0.8 + 0.2 * stabFac;
fast = 0.3 + 0.2 * stabFac;
``` wherein stabFac indicates a stability value between the last and second last frame in FFLC case or current and last frame in PFLC case.

The stability factor may, for example, represent a similarity between two signals, for example, between the current signal and a past signal. For example, the stability factor may, e.g., be bounded by [0:1]. A stability factor close to 1 or 1 may, e.g., mean that both signals are very similar and a stability factor close to 0 or 0 may, e.g., mean that both signals are very different. The similarity may, for example, be calculated on the spectral envelopes of two audio signals.

The stability factor θ may, for example, be calculated as:

$$\theta = 1.25 - \frac{1}{25}\sum_{k=0}^{N-1}(scfQ_{curr}(k) - scfQ_{prev}(k))^2$$

wherein:
scfQcurr indicates a scalefactor vector of the current frame, and
$scfQ_{prev}$ indicates a scalefactor vector of the previous frame
N indicates the number of scalefactors within the scalefactor vectors
θ indicates a stability factor, which is bounded by 0≤θ≤1
k indicates an index for a scalefactor vector In some embodiments, stabFac may, for example, be used differently for FFLC and for PFLC; i.e. it could be set a value between 0 and 1 depending on the stability for FFLC, whereas it could be set to 1 for PFLC.

Subsequently, corresponding cumulative attenuation factors (cum_fading_slow and cum_fading_fast, initialized with 1 at the beginning of each burst loss) may, for example, be derived, which may, e.g., change from frame to frame, for example, as follows:

```
cum_fading_slow = cum_fading_slow * slow;
cum_fading_fast = cum_fading_fast * fast;
``` wherein: cum_fading_slow indicates a slow cumulative damping factor; and wherein cum_fading_fast indicates a fast cumulative damping factor.

In an embodiment, the accumulation may, e.g., be done just for FFLC, but not for PFLC.

Furthermore, according to an embodiment, values for a first threshold (ad_ThreshFac_start) and a last threshold (ad_ThreshFac_end) may, e.g., be defined. In some embodiments, these values may, e.g., be chosen heuristically. Usually, both values may, e.g., be larger than one (1), and the first threshold is larger than the last threshold. Based on those two threshold limits, the threshold for the current frame (ad_threshFac) may, e.g., be determined based on the fading value (linFuncStartStop) as derived above:

```
ad_ThreshFac_start = 10;
ad_ThreshFac_end = 1.2;
ad_threshFac = (ad_ThreshFac_start - ad_ThreshFac_end) *
    linFuncStartStop + ad_ThreshFac_end;
``` wherein ad_ThreshFac_start indicates a first factor to mean energy, above which a stronger attenuation is applied; and wherein ad_ThreshFac_stop indicates a last factor to mean energy, above which a stronger attenuation is applied.

The threshold adjustment could be done just for FFLC, but not for PFLC. In this case, the threshold would be fix for subsequent frames.

Figure 8:
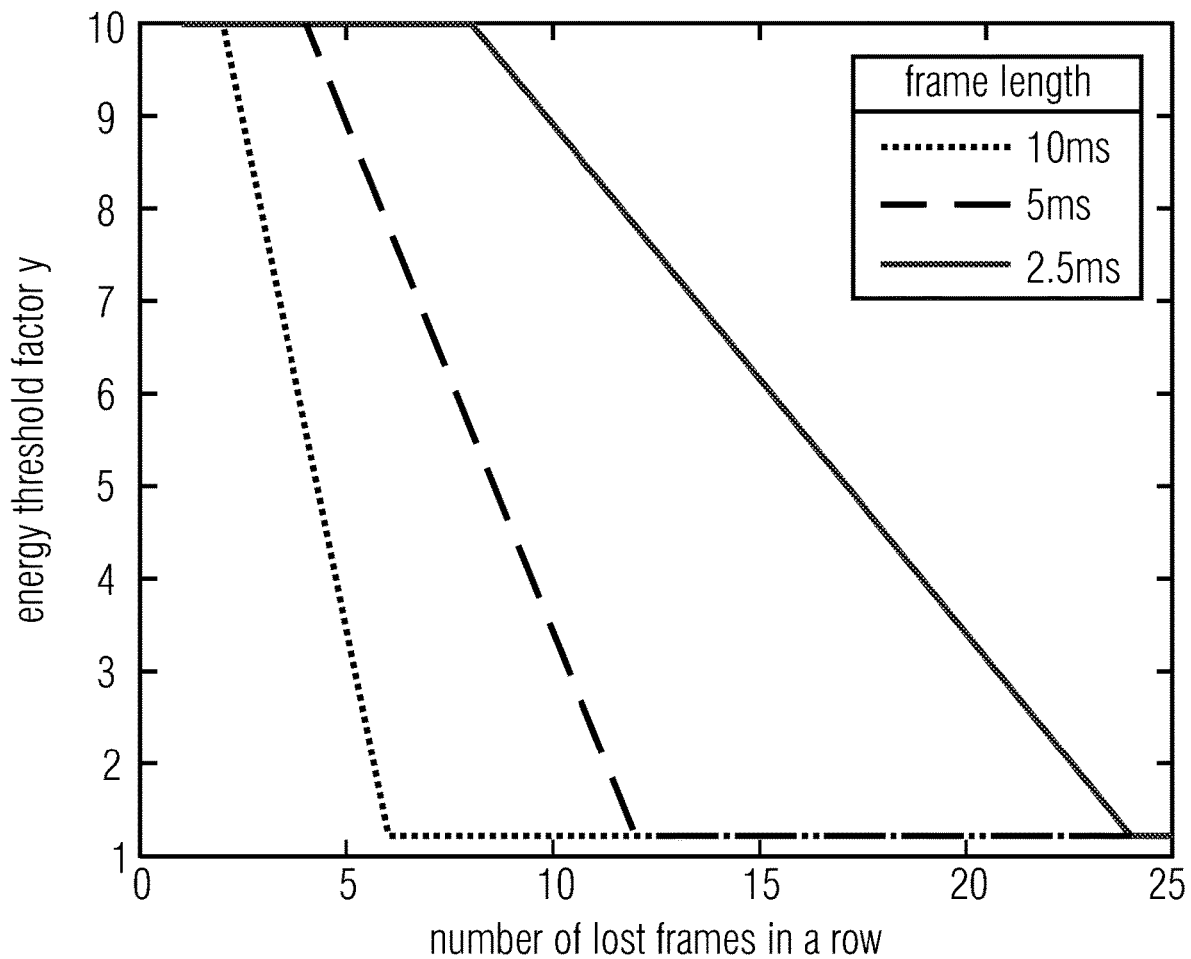
FIG. 8 illustrates an energy threshold factor according to an embodiment, which depends on a number of lost frames in a row and which further depends on a frame length.

FIG. 8 illustrates an energy threshold factor according to an embodiment, which depends on a number of lost frames in a row and which further depends on a frame length.

In particular, FIG. 8 provides an example for a threshold factor depending on the number of consecutively lost frames using the fading function, wherein the threshold factor decreases from 10 to 1.2 between 20 ms and 60 ms.

In a particular embodiment, the adaptive fading is operating on a bin granularity. It could be realized as follows:

```
frame_energy = mean(spec(k_be .. N_F - 1).^2);
energThreshold = ad_threshFac * frame_energy;
for k=k_be .. N_F - 1
    if (spec(k)^2) < energThreshold
        m = cum_fading_slow;
        n = 0;
    else
        m = cum_fading_fast;
        n = (cum_fading_slow-cum_fading_fast) * sqrt(energThreshold) *
            sign(spec_prev(k));
    end
    spec(k) = m * spec_prev(k) + n;
end
``` where:
k—spectral bin
$k_{be}$—first spectral bin which could not be recovered
$N_F$—number of spectral lines
spec_prev(k)—spectral value of bin k in last good frame (below referred to as $\hat{X}_{prev}(k)$)
spec(k)—spectral value of bin k in current frame.

The derivation of n in the else path makes sure, that the attenuation curve keeps larger values larger, and smaller values smaller.

Figure 9:
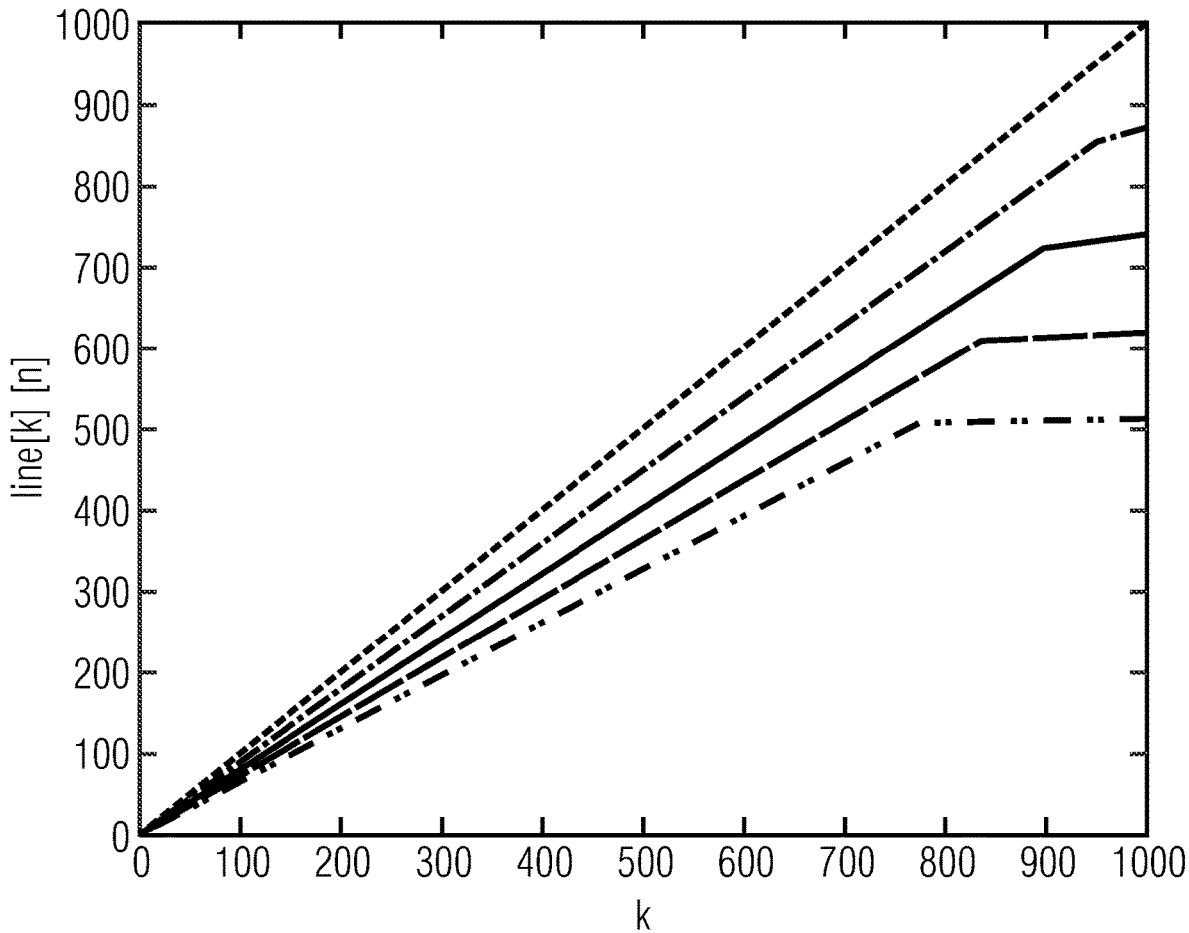
FIG. 9 illustrates a non-linear attenuation according to an embodiment, which depends on a number of lost frames in a row.

FIG. 9 depicts an example where cumulative damping is applied. Possible input values in the example are between 0 and 1000. n=0 refers to a received frame and provides some sort of reference. In the example, the initial slow attenuation factor is set to 0.9, and the initial fast attenuation factor is set to 0.4 (stabFac=0.5). In the second frame, the squares of those values are used, and so on, which makes subsequent curves flatter. At the same time, the threshold may, e.g., be reduced, which moves the twist of the successive curves further to the left.

In another particular embodiment, the adaptive fading is operating band wise. In that example, band wise energies are derived, and an adaptive damping is just applied to bins in bands, which are above the mean over all bands. In those cases, the energy of that band may, e.g., be used as threshold for bin wise adaptive damping. An exemplary implementation may, for example, be realized as follows:

```
bin_energy_per_band = zeros(ceil((N_F - k_be )/8),1);
idx = 1;
for k=k_be:8:(N_F-7)
    bin_energy_per_band(idx) = mean(spec(k:k+7).^2);
    idx = idx + 1;
end
energThreshold = ad_threshFac * mean(bin_energy_per_band);
idx = 1;
for k=k_be:8:(N_F-7)
    if bin_energy_per_band(idx) < energThreshold
        m = cum_fading_slow;
        spec(k:k+7) = m * spec_prev(k:k+7);
    else
        for j=k:k+7
            if (spec(j)^2) < bin_energy_per_band(idx)
                m = cum_fading_slow;
                n = 0;
            else
                m = cum_fading_fast;
                n = (cum_fading_slow-cum_fading_fast) *
                    sqrt(energThreshold) * sign(spec_prev(j));
            end
            spec(j) = m * spec_prev(j) + n;
        end
    end
    idx = idx + 1;
end
``` wherein:
k, j—spectral bin
$k_{be}$—first spectral bin which could not be recovered
$N_F$—number of spectral lines
spec_prev(k)—spectral value of bin k in last good frame (below referred to as $\hat{X}_{prev}(k)$)
spec(k)—spectral value of bin k in current frame
idx—band index
bin_energy_per_band—bin energy per band The storage of the spectral lines during a received frame as well as the insertion of the spectral lines during a (partially or fully) lost frame may, in general, be performed at any place between the decoding of the spectrum based on the information provided in the bitstream and the transformation back into the time domain. Referring to LC3, it may especially be performed, e.g., before or after SNS decoding (SNS=Spectral Noise Shaping), e.g., before or after TNS decoding (TNS=Temporal Noise Shaping), e.g., before or after the application of the global gain, and/or, e.g., before or after the noise filling.

The selection of the advantageous location may also vary depending on the availability of additional information for the partially or fully lost frame. It may, e.g., be performed at the beginning of the signal processing in the case of a partially lost frame (partial frame loss concealment); since in this case the parameters for the subsequent signal processing steps are available. It may, e.g., be performed at a later stage in the case of a fully lost frame (full frame loss concealment), since in this case no parameters of the subsequent signal processing steps are available. It may, however, e.g., still be performed before the SNS decoding, since this step allows a dedicated spectral shaping.

In the following, partial frame loss concealment according to some embodiments is described in more detail.

A particular implementation for partial frame loss concealment may, e.g., first apply the rescaling factor and then may, e.g., quantize spectral bins below a certain threshold to zero. This is shown in the following example pseudo code:

```
for k=k_be .. N_F - 1
    X̂_q(k) = X̂_q,lG(k) · fac;
    if |X̂_q(k)| < threshold
        X̂_q(k) = 0;
``` wherein:
k—spectral bin
$N_F$—number of spectral lines
$k_{be}$—first spectral bin which could not be recovered
$\widehat{X_q}(k)$—quantized spectral line k of the current frame
$\widehat{X_{q,lG}}(k)$—quantized spectral line k of the last non-FFLC frame
fac—rescaling factor
threshold—threshold value with the exemplary value of 0.625 to quantize to zero.

The rescaling factor depending on the global gains $fac_{gg}$ is derived as the ratio between current and the past global gain:

$$fac_{gg} = \frac{gg_{prev}}{gg}.$$

The rescaling factor depending on the energies $fac_{ener}$ is initialized with 1. If the following conditions are met $$\frac{1}{k_{be}} \sum_{k=0}^{k_{be}-1} \hat{X}_{prev}(k)^2 > \frac{1}{N_F - k_{be}} \sum_{k=k_{be}}^{N_F-1} \hat{X}_{prev}(k)^2. \quad 1$$

$$gg_{prev}^2 \cdot \sum_{k=0}^{k_{be}-1} \widehat{X_{q,lG}}(k)^2 > gg^2 \cdot \sum_{k=0}^{k_{be}-1} \widehat{X_q}(k)^2, \quad 2$$

this rescaling factor is set to the root of the ratio between the current and the past quantized spectrum multiplied with the square of their corresponding global gains:

$$fac_{ener} = \sqrt{\frac{gg^2 \cdot \sum_{k=0}^{k_{be}-1} \widehat{X_q}(k)^2}{gg_{prev}^2 \cdot \sum_{k=0}^{k_{be}-1} \widehat{X_{q,lG}}(k)^2}}.$$

The total rescaling factor is derived as $$fac = fac_{gg} \cdot fac_{ener}.$$

When $fac_{ener} \neq 1$, this leads to (the global gain values cancel each other out):

$$fac = \frac{gg_{prev}}{gg} \cdot \sqrt{\frac{gg^2 \cdot \sum_{k=0}^{k_{be}-1} \widehat{X_q}(k)^2}{gg_{prev}^2 \cdot \sum_{k=0}^{k_{be}-1} \widehat{X_{q,lG}}(k)^2}} = \sqrt{\frac{\sum_{k=0}^{k_{be}-1} \widehat{X_q}(k)^2}{\sum_{k=0}^{k_{be}-1} \widehat{X_{q,lG}}(k)^2}}.$$

The variables in the above equations have the following meaning:
k—spectral bin
$k_{be}$—first spectral bin that could not be recovered
$N_F$—number of spectral lines
$\widehat{X_{q,lG}}(k)$ quantized spectrum of last non-FFLC frame
$\widehat{X_q}(k)$—quantized spectrum of the current frame
$\hat{X}_{prev}(k)$—decoded spectrum of the last non-FFLC frame
gg—global gain of the current frame (if the quantized spectrum coded in the bitstream is rescaled with a global gain)
$gg_{prev}$—global gain of the last non-FFLC frame (if the quantized spectrum coded in the bitstream is rescaled with a global gain).

The following example pseudo code shows the determination of the rescaling factor according to an exemplary implementation:

```
fac = gg_prev/gg;
mean_nrg_high = mean(X̂_prev(k_be : N_F - 1).^2);
mean_nrg_low = mean(X̂_prev(0 : k_be-1).^2);
if (mean_nrg_low > mean_nrg_high)
    ener_prev = sum(X̂_q,lG(0 : k_be-1).^2);
    ener_curr = sum(X̂_q(0 : k_be-1).^2);
    if ener_prev*gg_prev^2 > ener_curr*gg^2
        fac = sqrt(ener_curr/ener_prev);
``` wherein:
fac—rescaling factor
gg—global gain of the current frame (if the quantized spectrum coded in the bitstream is rescaled with a global gain)
$gg_{prev}$—global gain of the last non-FFLC frame (if the quantized spectrum coded in the bitstream is rescaled with a global gain)
$k_{be}$—first spectral bin which could not be recovered
$N_F$—number of spectral lines
$\hat{X}_{prev}$—decoded spectrum of the last non-FFLC frame
$\widehat{X_{q,lG}}(k)$—quantized spectrum of the last non-FFLC frame
$\widehat{X_q}(k)$—quantized spectrum of the current frame
sqrt—square root function.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] P. Lauber and R. Sperschneider, "Error Concealment for Compressed Digital Audio," in *Audio Engineering Society,* 2001.
[2] J. Lecomte and A. Tomasek, "ERROR CONCEALMENT UNIT, AUDIO DECODER, AND RELATED METHOD AND COMPUTER PROGRAM FADING OUT A CONCEALED AUDIO FRAME OUT ACCORDING TO DIFFERENT DAMPING FACTORS FOR DIFFERENT FREQUENCY BANDS", WO 2017/153299 A2, published 2017.
[3] A. Rämö, A. Kurittu and H. Toukomaa, "EVS Channel Aware Mode Robustness to Frame Erasures," in *Interspeech* 2016, San Francisco, CA, USA, 2016.
[4] A. Venkatraman, D. J. Sinder, S. Shaminda, R. Vivek, D. Duminda, C. Venkata, V. Imre, K. Venkatesh, S. Benjamin, L. Jeremie, Z. Xingtao and M. Lei, "Improved Error Resilience for VoLTE and VoIP with 3GPP EVS Channel Aware Coding," in ICASSP 2015.
[5] M. Schnabel, G. Markovic, R. Sperschneider, C. Helmrich and J. Lecomte, "Apparatus and method realizing a fading of an mdct spectrum to white noise prior to fdns application". European Patent EP 3011559 B1, published 2017.

The invention claimed is:

1. A decoder for decoding a current frame to reconstruct an audio signal, wherein the audio signal is encoded within the current frame, wherein the current frame comprises a current bitstream payload, wherein the current bitstream payload comprises a plurality of payload bits, wherein the plurality of payload bits encodes a plurality of spectral lines of a spectrum of the audio signal, wherein each of the payload bits exhibits a position within the current bitstream payload, wherein the decoder comprises a decoding module configured to reconstruct the audio signal, and an output interface configured to output the audio signal, wherein the decoding module comprises a partial frame loss concealment mode, wherein, if the decoding module is in the partial frame loss concealment mode, the decoding module is configured to reconstruct the audio signal without conducting error concealment for one or more first spectral lines of the plurality of spectral lines of the spectrum, which exhibit a frequency being smaller than or equal to a threshold frequency, wherein said one or more first spectral lines have been encoded by a first group of one or more of the plurality of payload bits, and to reconstruct the audio signal by conducting error concealment for one or more second spectral lines of the plurality of spectral lines of the spectrum, which exhibit a frequency being greater than the threshold frequency, wherein said one or more second spectral lines have been encoded by a second group of one or more of the plurality of payload bits.

2. A decoder according to claim 1,
wherein the decoding module is configured to detect whether or not the current frame does not comprise any corrupted bits encoding said one or more first spectral lines of the spectrum of the audio signal which exhibit a frequency being smaller than or equal to the threshold frequency,
wherein the decoding module is configured to detect whether or not the current frame comprises one or more corrupted bits encoding said one or more second spectral lines of the spectrum of the audio signal which exhibit a frequency being greater than the threshold frequency,
wherein said one or more corrupted bits are one or more of the payload bits that are distorted or that are likely to be distorted, and
wherein, if the current frame does not comprise any corrupted bits encoding said one or more first spectral lines of the spectrum of the audio signal which exhibit a frequency being smaller than or equal to the threshold frequency and if the current frame comprises said one or more corrupted bits encoding said one or more second spectral lines of the spectrum of the audio signal which exhibit a frequency being greater than the threshold frequency, the decoding module is configured to conduct error concealment in the partial frame loss concealment mode by conducting error concealment for said one or more second spectral lines of the spectrum which are greater than the threshold frequency.

3. A decoder according to claim 2,
wherein, if the current frame does not comprise any corrupted bits encoding said one or more first spectral lines of the spectrum of the audio signal which exhibit a frequency being smaller than or equal to the threshold frequency and if the current frame comprises said one or more corrupted bits encoding said one or more second spectral lines of the spectrum of the audio signal which exhibit a frequency being greater than the threshold frequency, the decoding module is configured to reconstruct the audio signal by decoding said first group of said one or more of the plurality of payload bits which encode said one or more first spectral lines of the spectrum of the audio signal which exhibit a frequency being smaller than or equal to the threshold frequency.

4. A decoder according to claim 1,
wherein the decoding module is configured to detect whether the current frame is lost,
wherein, if the decoder has detected that the current frame is lost, the decoding module is configured to reconstruct the audio signal
by conducting error concealment for said one or more second spectral lines of the spectrum of the audio signal which exhibit a frequency being greater than the threshold frequency, and
by decoding without conducting error concealment, said first group of said one or more of the plurality of payload bits which encode said one or more first spectral lines for said one or more first frequencies of the spectrum of the audio signal being smaller than or equal to the threshold frequency, wherein said first group of said one or more of the plurality of payload bits are one or more payload bits of a redundant frame being different from the current frame.

5. A decoder according to claim 1,
wherein, if the decoding module is configured to conduct error concealment in a full frame loss concealment mode, the decoding module is configured to conduct error concealment for all spectral lines of the spectrum.

6. A decoder according to claim 5,
wherein the plurality of payload bits is a plurality of current payload bits,
wherein, if the decoding module is in the partial frame loss concealment mode, the decoding module is configured to conduct error concealment for said one or more second spectral lines of the spectrum of the audio signal which exhibit a frequency being greater than the threshold frequency, using one or more stored spectral lines which have been encoded by one or more previous payload bits of the previous bitstream payload of the previous frame.

7. A decoder according to claim 6,
wherein the spectrum is a current quantized spectrum,
wherein, if the decoding module is conducting error concealment in the partial frame loss concealment mode, the decoding module is configured to conduct error concealment for said one or more second spectral lines of the spectrum of the audio signal which exhibit a frequency being greater than the threshold frequency, to acquire one or more intermediate spectral lines of said current quantized spectrum, wherein the decoding module is configured to rescale the one or more intermediate spectral lines using a rescaling factor to reconstruct the audio signal.

8. A decoder according to claim 7,
wherein the decoding module is configured to determine the rescaling factor depending on at least one of
a global gain being encoded within said current bitstream payload and
a global gain being encoded within said previous bitstream payload, and
an energy of a previous quantized spectrum of said previous frame, an energy of a previous decoded spectrum of said previous frame, and
an energy of said current quantized spectrum of said current frame.

9. A decoder according to claim 8,
wherein the decoding module is configured to determine the rescaling factor, being a total rescaling factor, depends on a global gain rescaling factor,
wherein the decoding module is configured to determine the global gain rescaling factor according to $$fac_{gg} = \frac{gg_{prev}}{gg},$$

wherein $gg$ indicates said global gain being encoded within said current bitstream payload, and
wherein $gg_{prev}$ indicates said global gain being encoded within said previous bitstream payload, and wherein $fac_{gg}$ is the global gain rescaling factor.

10. A decoder according to claim 9,
wherein, $$\text{if } \frac{1}{k_{be}}\sum_{k=0}^{k_{be}-1}\hat{X}_{prev}(k)^2 > \frac{1}{N_F-k_{be}}\sum_{k=k_{be}}^{N_F-1}\hat{X}_{prev}(k)^2, \text{ or}$$

-continued $$\text{if } gg_{prev}^2 \cdot \sum_{k=0}^{k_{be}-1} \widehat{X_{q,lG}}(k)^2 > gg^2 \cdot \sum_{k=0}^{k_{be}-1} \widehat{X_q}(k)^2,$$

the decoding module is configured to determine that the total rescaling factor is equal to the global gain rescaling factor, wherein k indicates a spectral bin, wherein $k_{be}$ indicates a first spectral bin that could not be recovered, wherein $N_F$ indicates a number of spectral lines, wherein $\widehat{X_{q,lG}}(k)$ indicates the previous quantized spectrum of the previous frame being a last non-full frame loss concealment frame, wherein $\widehat{X_q}(k)$ indicates the current quantized spectrum of the current frame, wherein $\hat{X}_{prev}(k)$ indicates the previous decoded spectrum of the previous frame being said last non-full frame loss concealment frame.

11. A decoder according to claim 9,
wherein, $$\text{if } \frac{1}{k_{be}} \sum_{k=0}^{k_{be}-1} \hat{X}_{prev}(k)^2 > \frac{1}{N_F - k_{be}} \sum_{k=k_{be}}^{N_F-1} \hat{X}_{prev}(k)^2, \text{ and}$$

$$\text{if } gg_{prev}^2 \cdot \sum_{k=0}^{k_{be}-1} \widehat{X_{q,lG}}(k)^2 > gg^2 \cdot \sum_{k=0}^{k_{be}-1} \widehat{X_q}(k)^2,$$

the decoding module is configured to determine that the total rescaling factor moreover depends on an energy rescaling factor $$fac_{ener} = \sqrt{\frac{gg^2 \cdot \sum_{k=0}^{k_{be}-1} \widehat{X_q}(k)^2}{gg_{prev}^2 \cdot \sum_{k=0}^{k_{be}-1} \widehat{X_{q,lG}}(k)^2}},$$

wherein $fac_{ener}$ indicates the energy rescaling factor,
wherein k indicates a spectral bin, wherein $k_{be}$ indicates a first spectral bin that could not be recovered, wherein $N_F$ indicates a number of spectral lines, wherein $\widehat{X_{q,lG}}(k)$ indicates the previous quantized spectrum of the previous frame being a last non-full frame loss concealment frame, wherein $\widehat{X_q}(k)$ indicates the current quantized spectrum of the current frame, wherein $\hat{X}_{prev}(k)$ indicates the previous decoded spectrum of the previous frame being said last non-full frame loss concealment frame.

12. A decoder according to claim 11,
wherein, $$\text{if } \frac{1}{k_{be}} \sum_{k=0}^{k_{be}-1} \hat{X}_{prev}(k)^2 > \frac{1}{N_F - k_{be}} \sum_{k=k_{be}}^{N_F-1} \hat{X}_{prev}(k)^2, \text{ and}$$

$$\text{if } gg_{prev}^2 \cdot \sum_{k=0}^{k_{be}-1} \widehat{X_{q,lG}}(k)^2 > gg^2 \cdot \sum_{k=0}^{k_{be}-1} \widehat{X_q}(k)^2,$$

the decoding module is configured to determine the total rescaling factor f ac according to $$f\ ac = f\ ac_{gg} \times f\ ac_{ener},$$

or according to $$fac = \sqrt{\frac{\sum_{k=0}^{k_{be}-1} \widehat{X_q}(k)^2}{\sum_{k=0}^{k_{be}-1} \widehat{X_{q,lG}}(k)^2}},$$

or according to $$fac = \frac{gg_{prev}}{gg} \cdot \sqrt{\frac{gg^2 \cdot \sum_{k=0}^{k_{be}-1} \widehat{X_q}(k)^2}{gg_{prev}^2 \cdot \sum_{k=0}^{k_{be}-1} \widehat{X_{q,lG}}(k)^2}}.$$

13. A decoder according to claim 7,
wherein the decoding module is configured to determine the rescaling factor depending on whether or not
a mean energy of spectral bins of the previous decoded spectrum of the previous frame starting from a first spectral bin that cannot be reconstructed without conducting error concealment up to a top of the spectrum is greater than or equal to a mean energy of spectral bins of the previous decoded spectrum of the previous frame starting from zero up to said last spectral bin that can be reconstructed without conducting error concealment, or
an energy of spectral bins of said current quantized spectrum of the current frame starting from zero up to said last spectral bin that can be reconstructed without conducting error concealment is greater than or equal to an energy of spectral bins of the previous quantized spectrum of the previous frame starting from zero up to said last spectral bin that can be reconstructed without conducting error concealment.

14. A decoder according to claim 13,
wherein,
if the mean energy of the spectral bins of the previous decoded spectrum of the previous frame starting from said first spectral bin that cannot be reconstructed without conducting error concealment up to a top of the spectrum is smaller than the mean energy of the spectral bins of the previous decoded spectrum of the previous frame starting from zero up to said last spectral bin that can be reconstructed without conducting error concealment, and
if the energy of spectral bins of said current quantized spectrum of the current frame starting from zero up to said last spectral bin that can be reconstructed without conducting error concealment is smaller than the energy of the spectral bins of the previous quantized spectrum of the previous frame starting from zero up to said last spectral bin that can be reconstructed without conducting error concealment,
the decoding module is configured to determine the rescaling factor such that the rescaling factor is equal to the square root of the ratio of
the energy of the spectral bins of the current quantized spectrum starting from zero up to said last spectral bin that can be reconstructed without conducting error concealment multiplied with the square of a gain factor of the current frame, to the energy of the spectral bins of the previous quantized spectrum starting from zero up to said last spectral bin that can be reconstructed without conducting error concealment multiplied with the square of a gain factor of the previous frame.

15. A method for decoding a current frame to reconstruct an audio signal, wherein the audio signal is encoded within the current frame, wherein the current frame comprises a current bitstream payload, wherein the current bitstream payload comprises a plurality of payload bits, wherein the plurality of payload bits encodes a plurality of spectral lines of a spectrum of the audio signal, wherein each of the payload bits exhibits a position within the bitstream payload, wherein the method comprises:

reconstructing the audio signal, and outputting the audio signal, wherein, in a partial frame loss concealment mode, reconstructing the audio signal is conducted without conducting error concealment for one or more first spectral lines of the plurality of spectral lines of the spectrum, which exhibit a frequency being smaller than or equal to a threshold frequency, wherein said one or more first spectral lines have been encoded by a first group of one or more of the plurality of payload bits; and, in the partial frame loss concealment mode, reconstructing the audio signal is conducted by conducting error concealment for one or more second spectral lines of the plurality of spectral lines of the spectrum which exhibit a frequency being greater than the threshold frequency, wherein said one or more second spectral lines have been encoded by a second group of one or more of the plurality of payload bits.

16. A non-transitory digital storage medium having a computer program stored thereon to perform the method for decoding a current frame to reconstruct an audio signal, wherein the audio signal is encoded within the current frame, wherein the current frame comprises a current bitstream payload, wherein the current bitstream payload comprises a plurality of payload bits, wherein the plurality of payload bits encodes a plurality of spectral lines of a spectrum of the audio signal, wherein each of the payload bits exhibits a position within the bitstream payload, wherein the method comprises:

reconstructing the audio signal, and outputting the audio signal, when said computer program is run by a computer, wherein, in a partial frame loss concealment mode, reconstructing the audio signal is conducted without conducting error concealment for one or more first spectral lines of the plurality of spectral lines of the spectrum, which exhibit a frequency being smaller than or equal to a threshold frequency, wherein said one or more first spectral lines have been encoded by a first group of one or more of the plurality of payload bits; and, in the partial frame loss concealment mode, reconstructing the audio signal is conducted by conducting error concealment for one or more second spectral lines of the plurality of spectral lines of the spectrum which exhibit a frequency being greater than the threshold frequency, wherein said one or more second spectral lines have been encoded by a second group of one or more of the plurality of payload bits.

* * * * *